US012700561B2

(12) United States Patent　　　　(10) Patent No.:　US 12,700,561 B2

Dinu Gurtler et al.　　　　　　　(45) Date of Patent:　　Aug. 4, 2026

---

(54) MANIPULATOR, MANIPULATOR ARRAY, CHARGED PARTICLE TOOL, MULTI-BEAM CHARGED PARTICLE TOOL, AND METHOD OF MANIPULATING A CHARGED PARTICLE BEAM

(71) Applicant: ASML Netherlands B.V., Veldhoven (NL)

(72) Inventors: Laura Dinu Gurtler, Delft (NL); German Aksenov, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 762 days.

(21) Appl. No.: 18/064,205

(22) Filed: Dec. 9, 2022

(65) Prior Publication Data

US 2023/0109236 A1　　Apr. 6, 2023

Related U.S. Application Data

(63) Continuation of application No. PCT/EP2021/064371, filed on May 28, 2021.

(30) Foreign Application Priority Data

Jun. 11, 2020　(EP) .................................... 20179514

(51) Int. Cl.
H01J 37/147　　(2006.01)
H01J 37/317　　(2006.01)

(52) U.S. Cl.
CPC ........ H01J 37/1472 (2013.01); H01J 37/147 (2013.01); *H01J 37/3177* (2013.01)

(58) Field of Classification Search
CPC .. H01J 37/1472; H01J 37/147; H01J 37/3177; H01J 37/12; H01J 37/153;

(Continued)

(56) References Cited

U.S. PATENT DOCUMENTS 5,245,194 A　　9/1993　Oae et al.
5,557,105 A *　9/1996　Honjo ................. H01J 37/3007
　　　　　　　　　　　　　　　　　　　　250/397

(Continued)

FOREIGN PATENT DOCUMENTS

CN　　103620693　　3/2014
EP　　1676291　　7/2006

(Continued)

OTHER PUBLICATIONS

International Search Report issued in related PCT International Application No. PCT/EP2021/064371; mailed Aug. 10, 2021 (3 pgs.).

*Primary Examiner* — David E Smith
*Assistant Examiner* — Christopher J Gassen
(74) *Attorney, Agent, or Firm* — FINNEGAN, HENDERSON. FARABOW, GARRETT & DUNNER, LLP

(57)　　　　　ABSTRACT

A manipulator for manipulating a charged particle beam in a projection system, the manipulator comprising a substrate having opposing major surfaces in each of which is defined an aperture and a through-passage having an interconnecting surface extending between the apertures; wherein the interconnecting surface comprises one or more electrodes; the manipulator further comprising a potential divider comprising two or more resistive elements connected in series, the potential divider comprising an intermediate node between each pair of adjacent resistive elements, wherein at least one resistive element is formed within the substrate so as to extend between the opposing major surfaces; wherein the intermediate node is electrically connected to at least one of the one or more electrodes.

20 Claims, 8 Drawing Sheets

(58) Field of Classification Search
      CPC .............. H01J 37/28; H01J 2237/1504; H01J
                        2237/1516; H01J 2237/1202; H01J
                        2237/1205; H01J 2237/1532; H01J
                  37/045; H01J 37/09; B82Y 10/00; B82Y
                                        40/00; G03F 7/70
      See application file for complete search history.

(56)                    References Cited

U.S. PATENT DOCUMENTS 9,620,329  B1      4/2017  Cook et al.
  2005/0045821  A1 *    3/2005  Noji ........................ H01J 37/05
                                                              250/311
  2007/0020926  A1      1/2007  Kalvesten et al.
  2012/0154020  A1      6/2012  Lee et al.
  2012/0273690  A1 *   11/2012  Wieland .............. H01J 37/3177
                                                            250/396 R
  2014/0285253  A1      9/2014  Jeon et al.
  2016/0064179  A1      3/2016  Yamashita et al.
  2022/0406563  A1 *   12/2022  Del Tin ................... H01J 37/12
  2023/0037583  A1 *    2/2023  Wieland ................. H01J 37/09
  2023/0124558  A1 *    4/2023  De Langen ........... G03F 7/2059
                                                            250/396 R

FOREIGN PATENT DOCUMENTS

EP            2702595       3/2014
  JP           H0330248       2/1991
  TW          201810342       3/2018
  WO     WO 2012/148267      11/2012

* cited by examiner

MANIPULATOR, MANIPULATOR ARRAY, CHARGED PARTICLE TOOL, MULTI-BEAM CHARGED PARTICLE TOOL, AND METHOD OF MANIPULATING A CHARGED PARTICLE BEAM

CROSS-REFERENCE TO RELATED APPLICATIONS

This application claims priority of International application PCT/EP2021/064371, which was filed on 28 May 2021, and claims priority of EP application 20179514.3, which was filed on 11 Jun. 2020. All of these applications are incorporated herein by reference in their entireties.

FIELD

The embodiments of the present disclosure relate to a manipulator for manipulating a charged particle beam, as well as a manipulator array comprising an array of manipulators, a charged particle tool comprising the manipulator or the manipulator array, a multi-beam charged particle tool comprising the manipulator or manipulator array, and method of manipulating a charged particle beam using the manipulator, manipulator array, charged particle tool or multi-beam charged particle tool.

BACKGROUND

When manufacturing semiconductor integrated circuit (IC) chips, undesired pattern defects, as a consequence of, for example, optical effects and incidental particles, inevitably occur on a substrate (i.e. wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an import process during and/or after its manufacture.

Pattern inspection tools with a charged particle beam have been used to inspect objects, for example to detect pattern defects. These tools typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause electrons to be emitted from the surface, such as secondary electrons, backscattered electrons or Auger electrons. The generated secondary electrons may be emitted from the material structure of the sample. By scanning the primary electron beam as the probing spot over the sample surface, secondary electrons can be emitted across the surface of the sample. By collecting these emitted secondary electrons from the sample surface, a pattern inspection tool may obtain an image representing characteristics of the material structure of the surface of the sample.

Another application for a charged particle beam is lithography. The charged particle beam reacts with a resist layer on the surface of a substrate. A desired pattern in the resist can be created by controlling the locations on the resist layer that the charged particle beam is directed towards.

A way of improving the performance of tools for such applications is to use a charged particle tool that generates a multi-beam of charged particles. By illuminating a sample with a multi-beam of charged particles, each of the sub-beams in the multi-beam effectively operate in parallel.

There is a general need to improve the performance and/or throughput of a charged particle tool that illuminates samples with a multi-beam of charged particles by developing techniques that allow a reduction of the pitch between sub-beams of the multi-beam, increase the density of the beams in the multi-beam incidental on a sample and/or increase the number of sub-beams that may be used.

SUMMARY

Embodiments of the present disclosure are directed to a manipulator for manipulating a charged particle beam, as well as a manipulator array comprising an array of manipulators. The manipulator or the manipulator array may be for use in a charged particle tool, such as a multi-beam charged particle tool. The charged particle tool may be a tool for generating, illuminating, projecting and/or detecting one or more beams of charged particles.

According to some embodiments of the present disclosure, there is provided a manipulator for manipulating a charged particle beam in a projection system, the manipulator comprising: a substrate having opposing major surfaces in each of which is defined an aperture and a through-passage having an interconnecting surface extending between the apertures; wherein the interconnecting surface comprises one or more electrodes; the manipulator further comprising a potential divider comprising two or more resistive elements connected in series, the potential divider comprising an intermediate node between each pair of adjacent resistive elements, wherein at least one resistive element is formed within the substrate so as to extend between the opposing major surfaces; wherein the intermediate node is electrically connected to at least one of the one or more electrodes.

According to some embodiments of the present disclosure, there is provided a manipulator for manipulating a charged particle beam in an electron-optical projection system, the manipulator comprising: a substrate having major surfaces in each of which is defined an aperture and a through-passage having an interconnecting surface extending between the apertures and comprising electrodes arranged around the aperture; a potential divider comprising two or more resistive elements in electrical series between two electrodes, the potential divider being configured to distribute an applied voltage over the electrodes, wherein at least one of the resistive elements extends within the substrate between the opposing major surfaces.

According to some embodiments of the present disclosure, there is provided a manipulator array for manipulating a charged particle multi-beam, the manipulator array comprising an array of manipulators provided in a substrate having opposing major surfaces, each manipulator defining in the substrate an aperture and a through-passage having an interconnecting surface extending between the respective apertures; wherein each interconnecting surface comprises one or more electrodes; each manipulator further comprising a potential divider comprising two or more resistive elements connected in series, the potential divider comprising an intermediate node between each pair of adjacent resistive elements, wherein at least one resistive element is formed within the substrate so as to extend between the opposing major surfaces of the substrate; wherein the intermediate node is electrically connected to at least one of the one or more electrodes.

According to some embodiments of the present disclosure, there is provided a charged particle tool comprising: an illumination system configured to generate a charged particle beam, and a projection system configured to directing the charged particle beam onto a sample, wherein the projection system comprises the manipulator or the manipulator array.

According to some embodiments of the present disclosure, there is provided a multi-beam charged particle tool comprising: an illumination system configured to generate a charged particle beam, and a projection system configured to convert the charged particle beam into a multi-beam and to directing the multi-beam onto a sample, wherein the projection system comprises the manipulator or the manipulator array.

According to some embodiments of the present disclosure, there is provided a method of manipulating a charged particle beam using the manipulator, the manipulator array, the charged particle tool or the multi-beam charged particle tool.

Advantages will become apparent from the following description taken in conjunction with the accompanying drawings wherein are set forth, by way of illustration and example, certain embodiments of the present disclosure.

BRIEF DESCRIPTION OF FIGURES

The above and other aspects of the present disclosure will become more apparent from the description of exemplary embodiments, taken in conjunction with the accompanying drawings, in which:

FIG. 1 schematically depicts a charged particle beam inspection apparatus;

FIG. 5b schematically depicts, in plan view, a manipulator according to some embodiments of the present disclosure;

FIG. 5c schematically depicts, in plan view, a manipulator according to some embodiments of the present disclosure.

DETAILED DESCRIPTION

Figure 2:
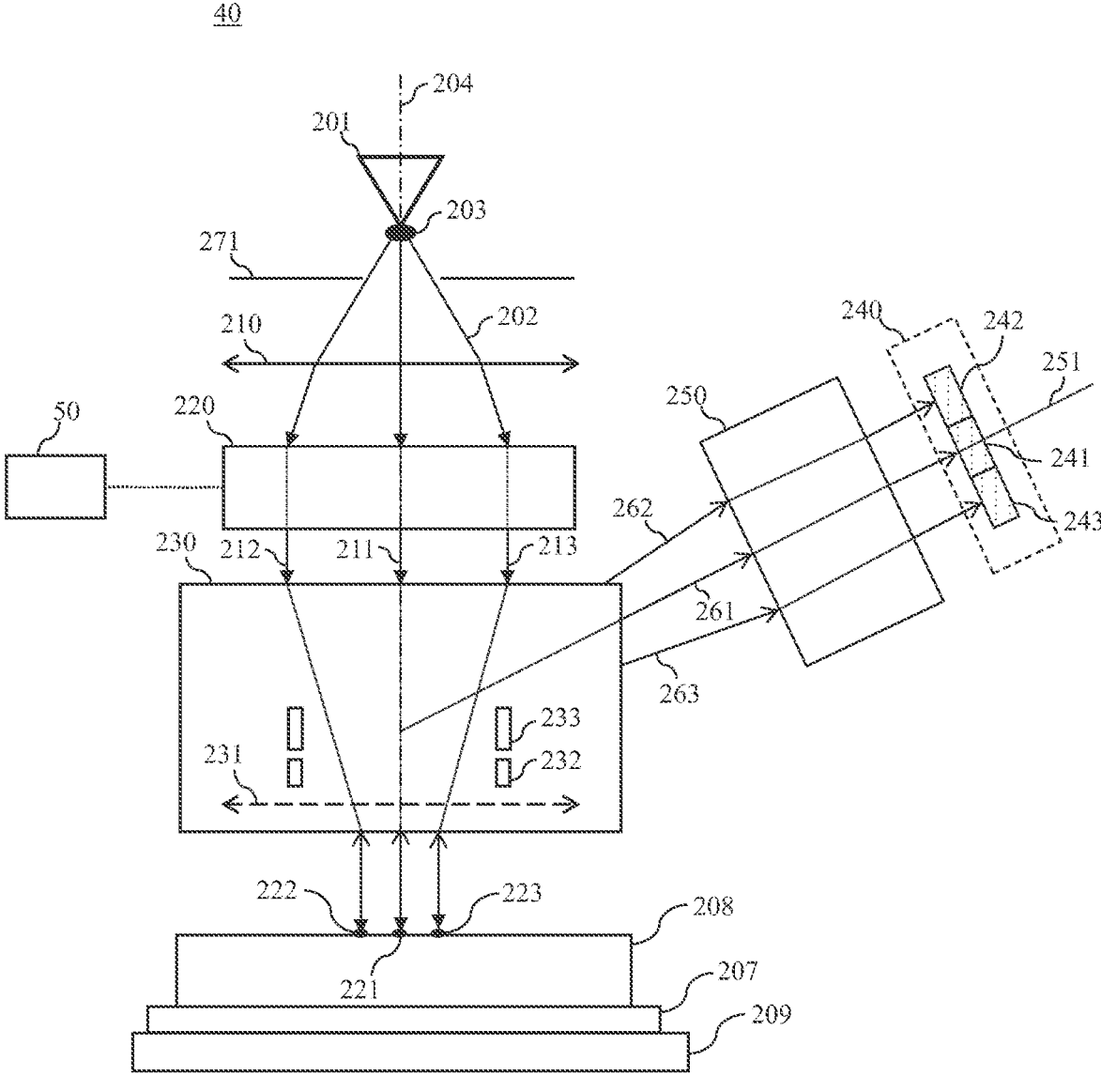
FIG. 2 schematically depicts a charged particle tool, which may form part of the charged particle beam inspection apparatus of FIG. 1.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the invention as recited in the appended claims.

The reduction of the physical size of devices, and enhancement of the computing power of electronic devices, may be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than 1/1000th of a human hair. Thus, it is not surprising that semiconductor IC manufacturing is a complex and time-consuming process, with hundreds of individual steps. Errors in even one step have the potential to dramatically affect the functioning of the final product. Just one "killer defect" may cause device failure. The goal of the manufacturing process is to improve the overall yield of the process. For example, to obtain a 75% yield for a 50-step process (where a step may indicate the number of layers formed on a wafer), each individual step must have a yield greater than 99.4%. If an individual step has a yield of 95%, the overall process yield would be as low as 7-8%.

While high process yield is desirable in an IC chip manufacturing facility, maintaining a high substrate (i.e. wafer) throughput, defined as the number of substrates processed per hour, is also essential. High process yield and high substrate throughput may be impacted by the presence of a defect. This is especially if operator intervention is required for reviewing the defects. Thus, high throughput detection and identification of micro and nano-scale defects by inspection tools (such as a Scanning Electron Microscope (SEW)) is essential for maintaining high yield and low cost.

A SEM comprises a scanning device and a detector apparatus. The scanning device comprises an illumination system that comprises an electron source, for generating primary electrons, and a projection system for scanning a sample, such as a substrate, with one or more focused beams of primary electrons. The primary electrons interact with the sample and generate interaction products, such as secondary electrons and/or backscattered electrons. A detection system captures the secondary electrons and/or backscattered electrons from the sample as the sample is scanned so that the SEM may create an image of the scanned area of the sample. For high throughput inspection, some of the inspection apparatuses use multiple focused beams, i.e. a multi-beam, of primary electrons. The component beams of the multi-beam may be referred to as sub-beams or beamlets. A multi-beam may scan different parts of a sample simultaneously. A multi-beam inspection apparatus may therefore inspect a sample at a much higher speed than a single-beam inspection apparatus.

In a multi-beam inspection apparatus, the paths of some of the primary electron beams are displaced away from the central axis, i.e. a mid-point of the primary electron-optical axis (also referred to herein as the charged particle axis), of the scanning device. To ensure all the electron beams arrive at the sample surface with substantially the same angle of incidence, sub-beam paths with a greater radial distance from the central axis need to be manipulated to move through a greater angle than the sub-beam paths with paths closer to the central axis. This stronger manipulation may cause aberrations that cause the resulting image to be blurry and out-of-focus. An example is spherical aberrations which bring the focus of each sub-beam path into a different focal plane. In particular, for sub-beam paths that are not on the central axis, the change in focal plane in the sub-beams is greater with the radial displacement from the central axis. Such aberrations and de-focus effects may remain associated with the secondary electrons from the target when they are detected, for example the shape and size of the spot formed by the sub-beam on the target will be affected. Such aberrations therefore degrade the quality of resulting images that are created during inspection.

An implementation of a known multi-beam inspection apparatus is described below.

The figures are schematic. Relative dimensions of components in drawings are therefore exaggerated for clarity. Within the following description of drawings the same or like reference numbers refer to the same or like components or entities, and only the differences with respect to the individual embodiments are described. While the description and drawings are directed to an electron-optical apparatus, it is appreciated that the embodiments are not used to limit the present disclosure to specific charged particles. References to electrons throughout the present document may therefore be more generally be considered to be references to charged particles, with the charged particles not necessarily being electrons.

Figure 1:
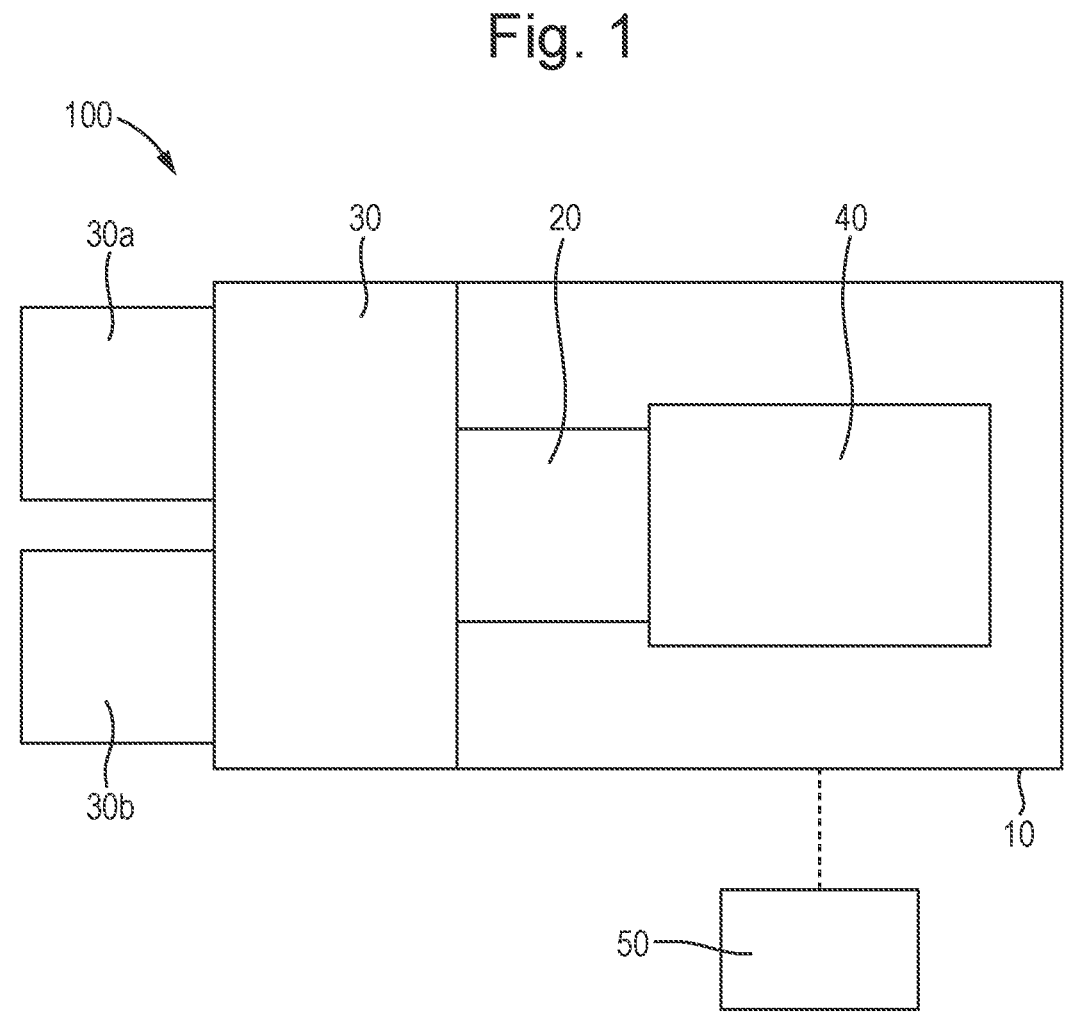

Reference is now made to FIG. 1, which is a schematic diagram illustrating an exemplary charged particle beam inspection apparatus 100. The charged particle beam inspection apparatus 100 of FIG. 1 includes a main chamber 10, a load lock chamber 20, a charged particle tool 40, an equipment front end module (EFEM) 30 and a controller 50. Charged particle tool 40 is located within main chamber 10. Charged particle tool 40 may be an electron beam tool 40. Charged particle tool 40 may be a single-beam tool or a multi-beam tool.

EFEM 30 includes a first loading port 30a and a second loading port 30b. EFEM 30 may include additional loading port(s). First loading port 30a and second loading port 30b may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in EFEM 30 transport the samples to load lock chamber 20.

Load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. After reaching the first pressure, one or more robot arms (not shown) transport the sample from load lock chamber 20 to main chamber 10. Main chamber 10 is connected to a main chamber vacuum pump system (not shown). The main chamber vacuum pump system removes gas molecules in main chamber 10 so that the pressure around the sample reaches a second pressure lower than the first pressure. After reaching the second pressure, the sample is transported to the electron beam tool by which it may be subject to measurement which may include charged particle flooding and/or inspection. A charged particle tool 40 may comprise either a single beam or a multi-beam electron-optical apparatus.

Controller 50 is electronically connected to charged particle beam tool 40. Controller 50 may be a processor (such as a computer) configured to control the charged particle beam inspection apparatus 100. Controller 50 may also include a processing circuitry configured to execute various signal and image processing functions. While controller 50 is shown in FIG. 1 as being outside of the structure that includes main chamber 10, load lock chamber 20, and EFEM 30, it is appreciated that controller 50 may be part of the tool or at least its structure. The controller 50 may be located in one of the component elements of the charged particle beam inspection apparatus 100 or it may be distributed over at least two of the component elements. While the present disclosure provides examples of main chamber 10 housing a charged particle tool, it should be noted that aspects of the disclosure in their broadest sense are not limited to a chamber housing a charged particle tool. Rather, it is appreciated that the foregoing principles may also be applied to other tools and other arrangements of apparatus, that operate under the second pressure.

Reference is now made to FIG. 2, which is a schematic diagram illustrating an exemplary charged particle tool 40. The charged particle tool 40 may form part of the charged particle beam inspection apparatus 100 of FIG. 1. The charged particle tool 40 may comprise a charged particle inspection tool 200. As shown in FIG. 1, the charged particle inspection tool 200 may be a multi-beam inspection tool 200. Alternatively, the charged particle inspection tool 200 may be a single-beam inspection tool. The charged particle inspection tool 200 comprises an electron source 201, a gun aperture plate 271, a condenser lens 210, optionally a source conversion unit 220, a primary projection system 230, a motorized stage 209, and a sample holder 207. The electron source 201, the gun aperture plate 271, the condenser lens 210, and optionally the source conversion unit 220 are the components of an illumination system comprised by the charged particle inspection tool 200. The sample holder 207 is supported by motorized stage 209 so as to hold and optionally to position a sample 208 (e.g., a substrate or a mask), for example for measurement, inspection or for charged particle flooding. Primary projection system 230 may comprise an objective lens 231 and optionally the source conversion unit 220 (if it is not part of the illumination system). Together the primary projection system and the illumination system may be referred to as a primary column or primary electron-optical system. A beam separator 233 and a deflection scanning unit 232 may be positioned inside primary projection system 230. The charged particle inspection tool 200 may further comprise a secondary projection system 250 and an associated electron detection device 240 (which together may form a detection column or detection system). Electron detection device 240 may comprise a plurality of detection elements 241, 242, and 243. The beam separator directs generated electrons from the sample to the secondary column for detection. Other detector arrangements might exist for example in the primary column for example associated with the objective lens 231 or the source conversation unit 220.

The components that are used to generate a primary beam may be aligned with a primary electron-optical axis of the charged particle inspection tool 200. These components may include: the electron source 201, gun aperture plate 271, condenser lens 210, source conversion unit 220, beam separator 233, deflection scanning unit 232, and primary projection apparatus 230. Secondary projection system 250 and its associated electron detection device 240 may be aligned with a secondary electron-optical axis 251 of the charged particle inspection tool 200.

The primary electron-optical axis 204 is comprised by the electron-optical axis of the part of the charged particle inspection tool 200 that is the illumination system. The secondary electron-optical axis 251 is the electron-optical axis of the part of the charged particle inspection tool 200 that is a detection system (or detection column). The primary electron-optical axis 204 may also be referred to herein as the primary optical axis (to aid ease of reference) or charged particle optical axis. The secondary electron-optical axis 251 may also be referred to herein as the secondary optical axis or the secondary charged particle optical axis.

Electron source 201 may comprise a cathode (not shown) and an extractor or anode (not shown). During operation, electron source 201 is configured to emit electrons as primary electrons from the cathode. The primary electrons are extracted or accelerated by the extractor and/or the anode to form a primary electron beam 202 that forms a primary beam crossover (virtual or real) 203. Primary electron beam 202 may be visualized as being emitted from primary beam crossover 203.

The formed primary electron beam 202 may be a single beam and a multi-beam may be generated from the single beam. At different locations along the beam path, the primary electron beam 202 may therefore be either a single beam or a multi-beam. By the time it reaches the sample, and preferably before it reaches the projection system, the primary electron beam 202 may be a multi-beam. Such a multi-beam may be generated from the primary electron beam in a number of different ways. For example, the multi-beam may be generated by a multi-beam array located before the crossover 203, a multi-beam array located in the source conversion unit 220, or a multi-beam array located at any point in between these locations. A multi-beam array may comprise a plurality of electron beam manipulating elements arranged in an array across the beam path. Each manipulating element may influence at least part of the primary electron beam to generate a sub-beam. Thus the multi-beam array interacts with an incident primary beam path to generate a multi-beam path down-beam of the multi-beam array. The interaction of the multi-beam array with the primary beam may include one or more aperture arrays, individual deflectors e.g. per sub-beam, lenses, stigmators and (aberration) correctors, again e.g. per sub-beam.

Gun aperture plate 271, in operation, is configured to block off peripheral electrons of primary electron beam 202 to reduce Coulomb effect. The Coulomb effect may enlarge the size of each of probe spots 221, 222, and 223 of primary sub-beams 211, 212, 213, and therefore deteriorate inspection resolution. A gun aperture plate 271 may also include multiple openings for generating primary sub-beams (not shown) even before the source conversion unit 220 and may be referred to as a coulomb aperture array.

Condenser lens 210 is configured to focus (or collimate) primary electron beam 202. In some embodiments, the condenser lens 210 may be designed to focus (or collimate) primary electron beam 202 to become a substantially parallel beam and be substantially normally incident onto source conversion unit 220. Condenser lens 210 may be a movable condenser lens that may be configured so that the position of its principle plane is movable. In some embodiments, the movable condenser lens may be configured to physically move, e.g. along the optical axis 204. Alternatively, the movable condenser lens may be constituted of two or more electro-optical elements (lenses) in which the principle plane of the condenser lens moves with a variation of the strength of the individual electro-optical elements. The (movable) condenser lens may be configured to be magnetic, electrostatic or a combination of magnetic and electrostatic lenses. In a further example, the condenser lens 210 may be an anti-rotation condenser lens. The anti-rotation condenser lens may be configured to keep the rotation angles unchanged when the focusing power (collimating power) of the condenser lens 210 is changed and/or when the principle plane of the condenser lens moves.

In some embodiments of the source conversion unit 220, the source conversion unit 220 may comprise an image-forming element array, an aberration compensator array, a beam-limit aperture array, and a pre-bending micro-deflector array. The pre-bending micro-deflector array may, for example, be optional and may be present in which the condenser lens does not ensure substantially normal incidence of the paths of a plurality of primary sub-beams 211, 212, 213 of primary electron beam 202 originating from the coulomb aperture array onto e.g. the beam-limit aperture array, the image-forming element array, and/or the aberration compensator array. In this arrangement, the image-forming element array may function as a multi-beam array to generate the plurality of sub-beams in the multi-beam path, i.e. primary sub-beams 211, 212, 213. The image forming element array may, for example, comprise a plurality electron beam manipulators such as micro-deflectors or micro-lenses (or a combination of both) to influence the plurality of primary sub-beams 211, 212, 213 of primary electron beam 202 and to form a plurality of parallel images (virtual or real) of primary beam crossover 203, one for each of the primary sub-beams 211, 212, and 213. The aberration compensator array may, for example, comprise a field curvature compensator array (not shown) and an astigmatism compensator array (not shown). The field curvature compensator array may, for example, comprise a plurality of micro-lenses to compensate field curvature aberrations of the primary sub-beams 211, 212, and 213. The astigmatism compensator array may comprise a plurality of micro-stigmators, or multi-pole electrodes, to compensate astigmatism aberrations of the primary sub-beams 211, 212, and 213. The beam-limit aperture array may be configured to limit or define diameters of individual primary sub-beams 211, 212, and 213. FIG. 2 shows three primary sub-beams 211, 212, and 213 as an example, and it should be understood that source conversion unit 220 may be configured to form any number of primary sub-beams. Controller 50 may be connected to various parts of charged particle beam inspection apparatus 100 of FIG. 1, such as source conversion unit 220, electron detection device 240, primary projection system 230, or motorized stage 209. As explained in further detail below, controller 50 may perform various image and signal processing functions. Controller 50 may also generate various control signals to govern operations of the charged particle beam inspection apparatus, including the charged particle multi-beam apparatus.

Condenser lens 210 may further be configured to adjust electric currents of primary sub-beams 211, 212, 213 down-beam of source conversion unit 220 by varying the focusing power (collimating power) of condenser lens 210. Alternatively, or additionally, the electric currents of the primary sub-beams 211, 212, 213 may be changed by altering the radial sizes of beam-limit apertures within the beam-limit aperture array corresponding to the individual primary sub-beams.

Objective lens 231 may be configured to focus sub-beams 211, 212, and 213 onto the sample 208 for inspection and may form three probe spots 221, 222, and 223 on the surface of sample 208.

Beam separator 233 may be, for example, a Wien filter comprising an electrostatic deflector generating an electro-static dipole field and a magnetic dipole field (not shown in FIG. 2). In operation, beam separator 233 may be configured to exert an electrostatic force by electrostatic dipole field on individual electrons of primary sub-beams 211, 212, and 213. In some embodiments, the electrostatic force is equal in magnitude but opposite in direction to the magnetic force exerted by magnetic dipole field of beam separator 233 on the individual primary electrons of the primary sub-beams 211, 212, and 213. Primary sub-beams 211, 212, and 213 may therefore pass at least substantially straight through beam separator 233 with at least substantially zero deflection angles. The direction of the magnetic force depends on the direction of motion of the electrons while the direction of the electrostatic force does not depend on the direction of motion of the electrons. So because the secondary electrons and backscattered electrons generally move in an opposite direction compared to the primary electrons, the magnetic force exerted on the secondary electrons and backscattered electrons will no longer cancel the electrostatic force and as a result the secondary electrons and backscattered electrons moving through the beam separator 233 will be deflected away from the optical axis 204.

Deflection scanning unit 232, in operation, is configured to deflect the paths of primary sub-beams 211, 212, and 213 to scan probe spots 221, 222, and 223 across individual scanning areas in a section of the surface of sample 208. In response to incidence of primary sub-beams 211, 212, and 213 or probe spots 221, 222, and 223 on sample 208, electrons are generated from the sample 208 which include secondary electrons and backscattered electrons. The secondary electrons propagate in three secondary electron beams 261, 262, and 263. The secondary electron beams 261, 262, and 263 typically have secondary electrons (having electron energy ≤50 eV) and may also have at least some of the backscattered electrons (having electron energy between 50 eV and the landing energy of primary sub-beams 211, 212, and 213). The beam separator 233 is arranged to deflect the paths of the secondary electron beams 261, 262, and 263 towards the secondary projection system 250. The secondary projection system 250 subsequently focuses the path of secondary electron beams 261, 262, and 263 onto a plurality of detection regions 241, 242, and 243 of electron detection device 240. The detection regions may, for example, be the separate detection elements 241, 242, and 243 that are arranged to detect corresponding secondary electron beams 261, 262, and 263. The detection regions may generate corresponding signals which are, for example, sent to controller 50 or a signal processing system (not shown), e.g. to construct images of the corresponding scanned areas of sample 208.

The detection elements 241, 242, and 243 may detect the corresponding secondary electron beams 261, 262, and 263. On incidence of secondary electron beams with the detection elements 241, 242 and 243, the elements may generate corresponding intensity signal outputs (not shown). The outputs may be directed to an image processing system (e.g., controller 50). Each detection element 241, 242, and 243 may comprise one or more pixels. The intensity signal output of a detection element may be a sum of signals generated by all the pixels within the detection element.

The controller 50 may comprise image processing system that includes an image acquirer (not shown) and a storage device (not shown). For example, the controller may comprise a processor, computer, server, mainframe host, terminals, personal computer, any kind of mobile computing devices, and the like, or a combination thereof. The image acquirer may comprise at least part of the processing function of the controller. Thus the image acquirer may comprise at least one or more processors. The image acquirer may be communicatively coupled to an electron detection device 240 of the apparatus 40 permitting signal communication, such as an electrical conductor, optical fiber cable, portable storage media, IR, Bluetooth, internet, wireless network, wireless radio, among others, or a combination thereof. The image acquirer may receive a signal from electron detection device 240, may process the data comprised in the signal and may construct an image therefrom. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled to the image acquirer and may be used for saving scanned raw image data as original images, and post-processed images.

The image acquirer may acquire one or more images of a sample based on an imaging signal received from the electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time period. The multiple images may be stored in the storage. The controller 50 may be configured to perform image processing steps with the multiple images of the same location of sample 208.

The controller 50 may include measurement circuitry (e.g., analog-to-digital converters) to obtain a distribution of the detected secondary electrons. The electron distribution data, collected during a detection time window, may be used in combination with corresponding scan path data of each of primary sub-beams 211, 212, and 213 incident on the sample surface, to reconstruct images of the sample structures under inspection. The reconstructed images may be used to reveal various features of the internal or external structures of sample 208. The reconstructed images may thereby be used to reveal any defects that may exist in the sample.

The controller 50 may, e.g. further control the motorized stage 209 to move the sample 208 during, before or after inspection of the sample 208. In some embodiments, the controller 50 may enable the motorized stage 209 to move sample 208 in a direction, e.g. continuously, for example at a constant speed, at least during sample inspection. The controller 50 may control movement of the motorized stage 209 so that it the speed of the movement of the sample 208 changes, e.g. dependent on various parameters. For example, the controller may control the stage speed (including its direction) depending on the characteristics of the inspection steps of scanning process.

Although FIG. 2 shows that the charged particle inspection tool 200 uses three primary electron sub-beams, it is appreciated that the charged particle inspection tool 200 may use two or a greater number of primary electron sub-beams, for example 9, 49, 121, more than 1000, 10,000 and as much as 100,000. The present disclosure does not limit the number of primary electron beams used in the charged particle inspection tool 200. The charged particle inspection tool 200 may also be a single-beam inspection tool 200, which uses a single charged particle beam.

Figure 3:
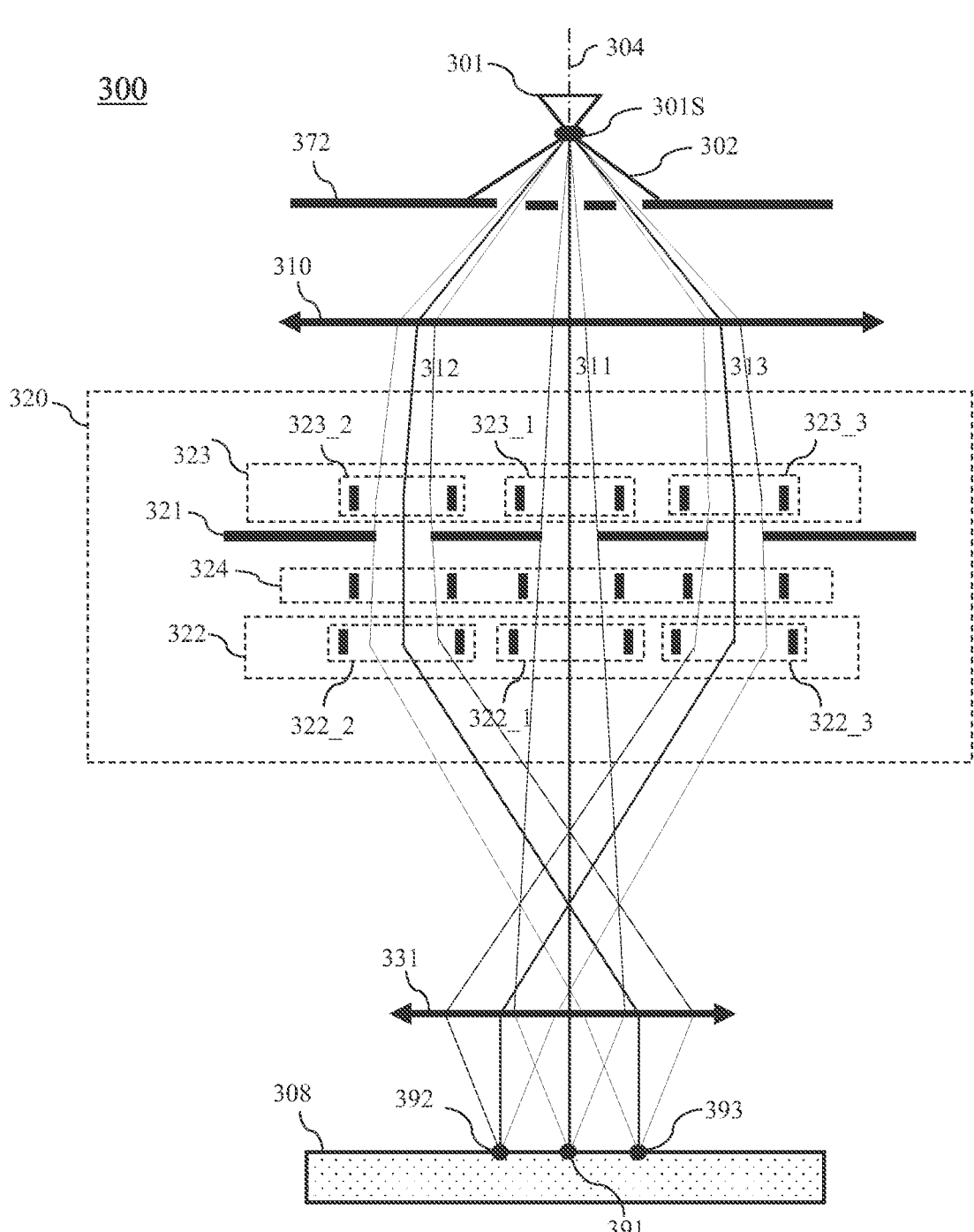
FIG. 3 schematically depicts a multi-beam tool illustrating an exemplary configuration of the source conversion unit.

Reference is now made to FIG. 3, which is a schematic diagram of exemplary multi-beam tool 300 illustrating an exemplary configuration of the source conversion unit 220 of the exemplary charged particle beam inspection tool 200 of FIG. 1. The multi-beam tool 300 may comprise an electron source 301, a pre-sub-beam-forming aperture array 372 (further also referred to as coulomb aperture array 372), a condenser lens 310 (similar to condenser lens 210 of FIG. 2), a source conversion unit 320 (similar to source conversion unit 220 of FIG. 2), an objective lens 331 (similar to objective lens 231 of FIG. 2), and a sample 308 (similar to sample 208 of FIG. 2). The electron source 301, the coulomb aperture array 372, and the condenser lens 310 may be the components of an illumination apparatus comprised by the tool 300. The source conversion unit 320 and the objective lens 331 may be the components of a projection apparatus comprised by the tool 300. The source conversion unit 320 may be similar to source conversion unit 220 of FIG. 2 in which the image-forming element array of FIG. 2 is image-forming element array 322, the aberration compensator array of FIG. 2 is aberration compensator array 324, the beam-limit aperture array of FIG. 2 is beam-limit aperture array 321, and the pre-bending micro-deflector array of FIG. 2 is pre-bending micro-deflector array 323. The electron source 301, the coulomb aperture array 372, the condenser lens 310, the source conversion unit 320, and the objective lens 331 are aligned with a primary electron-optical axis 304 of the apparatus. The electron source 301 generates a primary-electron beam 302 generally along the primary electron-optical axis 304 and with a source crossover (virtual or real) 301S. The coulomb aperture array 372 cuts the peripheral electrons of primary electron beam 302 to reduce a consequential Coulomb effect. The Coulomb effect is a source of aberration to the sub-beams due to interaction between electrons in different sub-beam paths. The primary-electron beam 302 may be trimmed into a specified number of sub-beams, such as three sub-beams 311, 312 and 313, by the coulomb aperture array 372 of a pre-sub-beam-forming mechanism. Although three sub-beams and their paths are referred to in the previous and following description, it should be understood that the description is intended to apply an apparatus, tool, or system with any number of sub-beams. The source conversion unit 320 may include a beamlet-limit aperture array 321 with beam-limit apertures configured to define the outer dimensions of the sub-beams 311, 312, and 313 of the primary electron beam 302. The source conversion unit 320 may also include an image-forming element array 322 with image-forming micro-deflectors, 322_1, 322_2, and 322_3. There is a respective micro-deflector associated with the path of each sub-beam. The micro-deflectors 322_1, 322_2, and 322_3 are configured to deflect the paths of the sub-beams 311, 312, and 313 towards the electron-optical axis 304. The deflected sub-beams 311, 312 and 313 form virtual images (not shown) of source crossover 301S. The virtual images are projected onto the sample 308 by the objective lens 331 and form probe spots thereon, which are the three probe spots, 391, 392, and 393. Each probe spot corresponds to the location of incidence of a sub-beam path on the sample surface. The source conversion unit 320 may further comprise an aberration compensator array 324 configured to compensate aberrations that may be present in each of the sub-beams. The aberrations in each sub-beam may be present on the probe spots, 391, 392, and 393 that would be formed a sample surface. The aberration compensator array 324 may, for example, include a field curvature compensator array (not shown) with micro-lenses, i.e. the aberration compensator array 324 may comprise a micro-lens array. The field curvature compensator and micro-lenses may, for example, be configured to compensate the individual sub-beams for field curvature aberrations evident in the probe spots, 391, 392, and 393. The aberration compensator array 324 may include an astigmatism compensator array (not shown) with micro-stigmators, i.e. the aberration compensator array 324 may comprise a micro-stigmator array. The micro-stigmators may, for example, be controlled to operate on the sub-beams to compensate astigmatism aberrations that are otherwise present in the probe spots, 391, 392, and 393.

The source conversion unit 320 may further comprise a pre-bending micro-deflector array 323 with pre-bending micro-deflectors 323_1, 323_2, and 323_3 to bend the sub-beams 311, 312, and 313 respectively. The pre-bending micro-deflectors 323_1, 323_2, and 323_3 may bend the path of the sub-beams onto the beamlet-limit aperture array 321. In some embodiments, the pre-bending micro-deflector array 323 may be configured to bend the sub-beam path of sub-beams towards the orthogonal of the plane of beamlet-limit aperture array 321. In an alternative example, the condenser lens 310 may adjust the path direction of the sub-beams onto the beamlet-limit aperture array 321. The condenser lens 310 may, for example, focus (collimate) the three sub-beams 311, 312, and 313 to become substantially parallel beams along primary electron-optical axis 304, so that the three sub-beams 311, 312, and 313 are incident substantially perpendicularly onto source conversion unit 320, which may correspond to the beamlet-limit aperture array 321. In such alternative example, the pre-bending micro-deflector array 323 may not be necessary.

The image-forming element array 322, the aberration compensator array 324, and the pre-bending micro-deflector array 323 may comprise multiple layers of sub-beam manipulating devices, some of which may be in the form or arrays, for example: micro-deflectors, micro-lenses, or micro-stigmators.

In the current example of the source conversion unit 320, the paths of the sub-beams 311, 312 and 313 of the primary electron beam 302 are respectively deflected by the micro-deflectors 322_1, 322_2 and 322_3 of image-forming element array 322 towards the primary electron-optical axis 304. It should be understood that the sub-beam 311 path may already correspond to the electron-optical axis 304 prior to reaching micro-deflector 322_1, accordingly the sub-beam 311 path may not be deflected by micro-deflector 322_1.

The objective lens 331 focuses the sub-beams onto the surface of the sample 308, i.e., it projects the three virtual images onto the sample surface. The three images formed by three sub-beams 311 to 313 on the sample surface form three probe spots 391, 392 and 393 thereon. In some embodiments, the deflection angles of sub-beams 311 to 313 are adjusted to pass through or approach the front focal point of objective lens 331 to reduce or limit the off-axis aberrations of three probe spots 391 to 393.

In the example of a charged particle inspection tool 300 as shown in FIG. 3 the beam path of the secondary electrons, beam separator (similar as Wien filter 233), secondary projection optics (similar as secondary projection optics 250 of FIG. 2) and electron detection device (similar as electron detection device 240) have been omitted for clarity reasons. It should be clear however that similar beam separator, secondary projection optics and electron detection device may be present in the current example of FIG. 3 to register and generate an image of the sample surface using the secondary electrons or backscattered electrons.

At least some of the above-described components in FIG. 2 and FIG. 3 may individually, or in combination with each other, be referred to as a manipulator array, or manipulator, because they manipulate the paths of one or more beams, or sub-beams, of charged particles.

The above described multi-beam tool comprises a single source of charged particles. The multi-beam tool comprises an illumination apparatus and a projection apparatus. The illumination apparatus may generate a multi-beam of charged particles from the beam of electrons from the source. The projection apparatus projects a multi-beam of charged particles towards a sample. At least part of the surface of a sample may be scanned with the multi-beam of charged particles.

A multi-beam tool comprises one or more electron-optical devices for manipulating the sub-beams of the multi-beam of charged particles. The applied manipulation may be, for example, a deflection of the paths of sub-beams and/or a focusing operation applied to the sub-beams. The one or more electron-optical devices may comprise MEMS, for example electrostatically actuating MEMS.

The charged particle tool may comprise beam path manipulators located up-beam of the electron-optical device and, optionally, in the electron-optical device. Beam paths may be manipulated linearly in directions orthogonal to the charged particle axis, i.e. optical axis, by, for example, two electrostatic deflector sets operating across the whole beam. The two electrostatic deflector sets may be configured to deflect the beam path in orthogonal directions. Each electrostatic deflector set may comprise two electrostatic deflectors located sequentially along the beam path. The first electrostatic deflector of each set applies a correcting deflection, and the second electrostatic deflector restores the beam to the correct angle of incidence on the electron-optical device. The correcting deflection applied by the first electrostatic deflector may be an over correction so that the second electrostatic deflector can apply a deflection for ensuring the desired angle of incidence to the MEMS. The location of the electrostatic deflector sets could be at a number of locations up-beam of the electron-optical device. Beam paths may be manipulated rotationally. Rotational corrections may be applied by a magnetic lens. Rotational corrections may additionally, or alternatively, be achieved by an existing magnetic lens such as the condenser lens arrangement.

Although not shown, embodiments of the charged particle tool also include a charged particle projection apparatus that divides a charged particle beam from a source into a plurality of sub-beams. A plurality of respective objective lenses may project the sub-beams onto a sample. In some embodiments, a plurality of condenser lenses is provided up-beam from the objective lenses. The condenser lenses focus each of the sub-beams to an intermediate focus up-beam of the objective lenses. In some embodiments, collimators are provided up-beam from the objective lenses. Correctors may be provided to reduce focus error and/or aberrations. In some embodiments, such correctors are integrated into or positioned directly adjacent to the objective lenses. Where condenser lenses are provided, such correctors may additionally, or alternatively, be integrated into, or positioned directly adjacent to, the condenser lenses and/or positioned in, or directly adjacent to, the intermediate foci. A detector is provided to detect charged particles emitted by the sample. The detector may be integrated into the objective lens. The detector may be on the bottom surface of the objective lens so as to face a sample in use. The condenser lenses, objective lenses and/or detector may be formed as MEMS or CMOS devices.

The source conversion unit 220, 320 may comprise the pre-bending micro-deflector array 323 (comprising an array of deflectors, in particular an array of micro-deflectors), the aberration compensator array 324 (comprising an array of stigmators, in particular an array of micro-stigmators and/or an array of lenses, in particular an array of micro-lenses) and the image-forming array 322 (comprising an array of deflectors, in particular an array of micro-deflectors). Each of these arrays comprises electrical elements (i.e. the deflectors, stigmators and lenses) with one or more electrodes. Different voltages may be applied to these electrodes so as to control the beamlets 311, 312, 313. Currently, each of these electrodes is wired or routed separately to apply a respective voltage, i.e. each electrode is provided with a voltage by a respective individual wire or routing. However, providing each electrode with individual routings requires volume in a design of manipulators. Such routing requires a relatively large space between the electrical elements, such that the pitch between electrical elements in relatively large.

The throughput of the charged particle inspection tool 200, 300 is proportional to the number of beamlets 211, 212, 213 used in the charged particle inspection tool 200, 300. It is thus desirable to maximize the number of beamlets 211, 212, 213 by increasing, desirably maximizing, the number of electrical elements in each of the arrays of the source conversion unit 220, 320. One way to increase the number of electrical elements in each array is to decrease the pitch between the electrical elements. The pitch may be decreased, for example, by reducing the number of routings required to provide the electrodes of each electrical elements with a voltage, thereby reducing the space required for wiring.

Figure 4A:
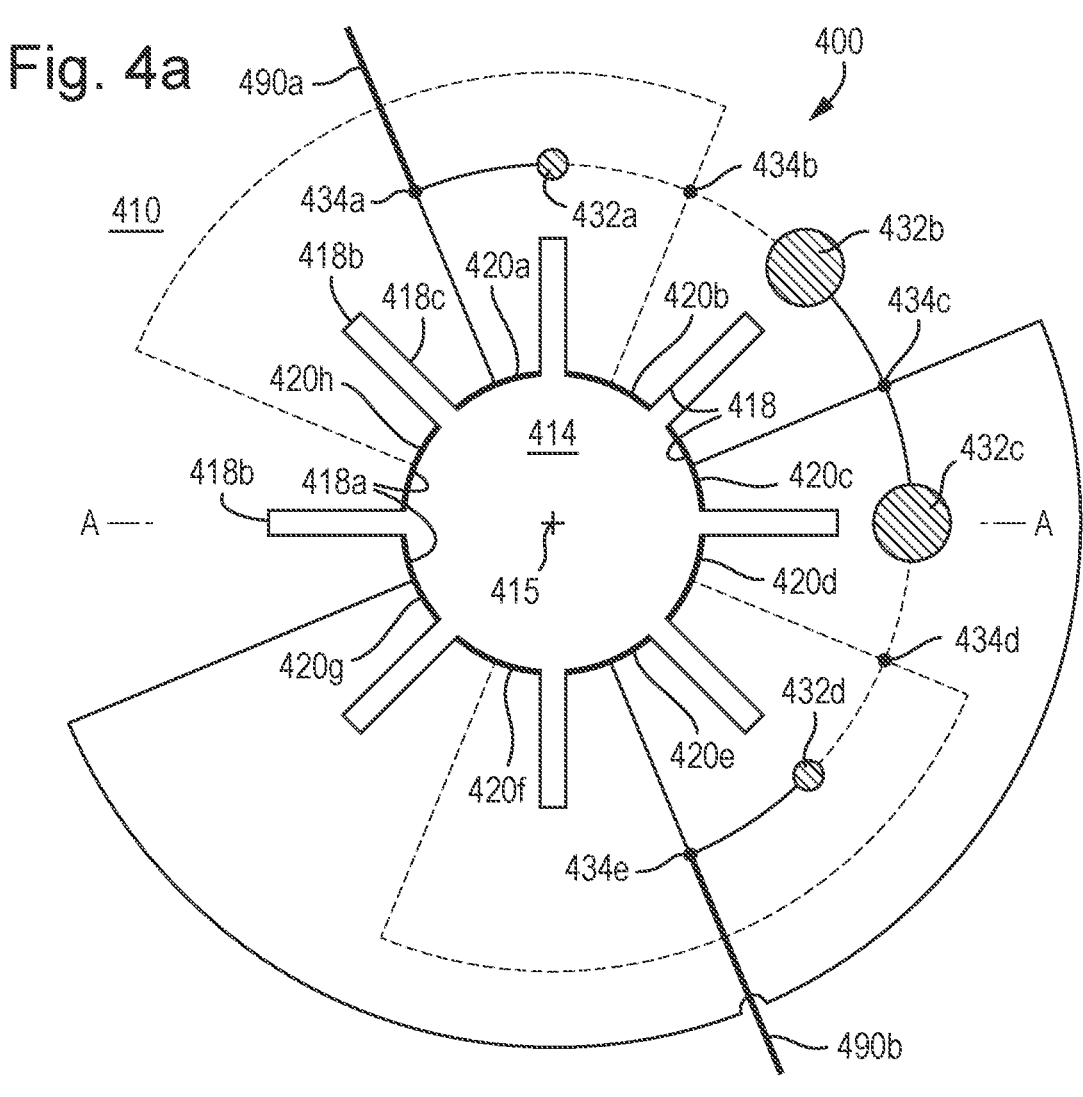
FIG. 4a schematically depicts, in plan view, a manipulator according to some embodiments of the present disclosure.
Figure 4B:
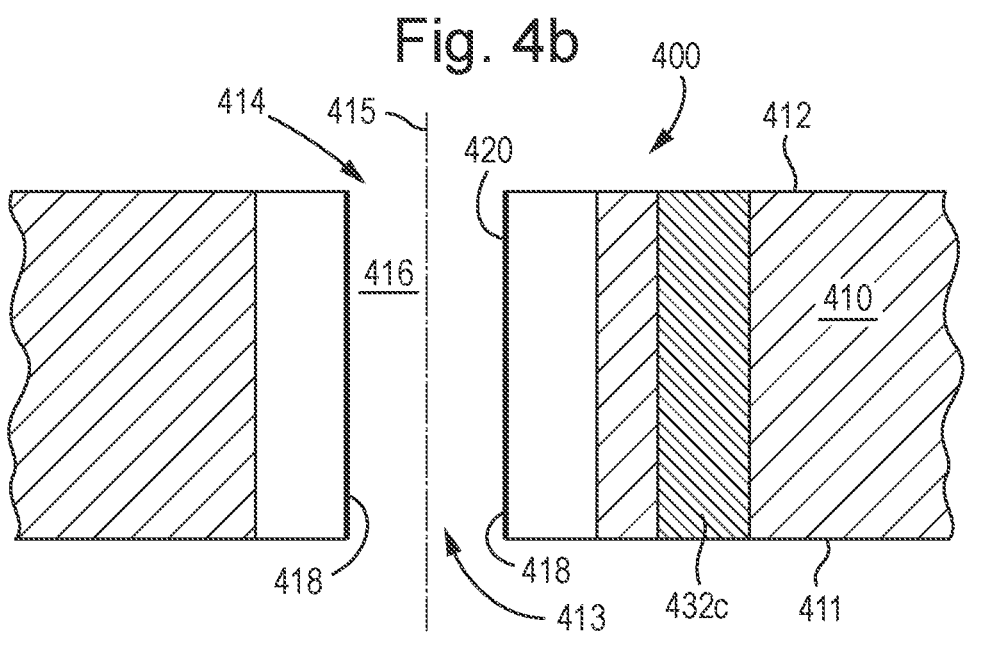
FIG. 4b schematically depicts the manipulator of FIG. 4a in cross-section.

FIG. 4 schematically depicts an example of a manipulator 400. The manipulator 400 is for manipulating the path of a charged particle beam, e.g. of one of the beamlets 211, 212, 213, in a projection system, for example in the projection system of the charged particle tool 200, 300 of FIG. 2 or of FIG. 3. FIG. 4a shows the manipulator 400 in plan view and FIG. 4b shows the manipulator in cross-section along line A-A of FIG. 4a.

As shown in FIG. 4, the manipulator 400 may be a multi-pole arrangement in which each pole is a separate electrode which in operation may influence the path of a charged-particle beam passing through the manipulator 400. The manipulator 400 may be a deflector, such as one of the micro-deflectors of the pre-bending micro-deflector array 323 or of the image forming array 322 of FIG. 3. Alternatively, the manipulator 400 may be a stigmator, such as one of the micro-stigmators of the aberration compensator array 324 of FIG. 3. Further alternatively, the manipulator 400 may be a lens, such as one of the micro-lenses of the aberration compensator array 324 of FIG. 3. As a lens the manipulator 400 may be a single electrode or a multipole operated at a common potential. In general, the manipulator 400 may be any element, e.g. electrical element, configured to manipulate (i.e. deflect, focus, deform, correct, or otherwise influence) the path of the charged particle beam.

The manipulator 400 comprises a substrate 410. As shown in FIG. 4b, the substrate has opposing major surfaces 411, 412. In each of the opposing major surfaces 411, 412, an aperture 413, 414 is defined. The manipulator 400 has a through-passage 416 having an interconnecting surface 418 extending between the apertures 413, 414.

The interconnecting surface 418 comprises one or more electrodes 420a-h. The interconnecting surface 418 may comprise a plurality of electrodes 420a-h, for example if the manipulator 400 is a micro-deflector or micro-stigmator. Adjacent electrodes 420a-h may be electrically isolated from each other. Each electrode may extend between the opposing major surfaces 411, 412, for example along the entire length of the interconnecting surface 418 between the two major surfaces 411, 412. The interconnecting surface 418 may comprise at least four (4) electrodes 420a-h, preferably at least eight (8) electrodes 420a-h, further preferably at least sixteen (16) electrodes 420a-h. The interconnecting surface may comprise a number of electrodes 420a-h that is a multiple of four. The interconnecting surface 418 could also comprise only one electrode 420a, for example when the manipulator 400 is part, such as a focusing electrode, of a micro-lens.

As shown in FIG. 4a, the manipulator 400 comprises a potential divider. The potential divider comprises two or more resistive elements 432a-d (e.g. resistors) connected in series. The potential divider comprises an intermediate node 434b-d between each pair of adjacent resistive elements 432a-d. The potential divider also comprises two end nodes 434a, 434e. At least one intermediate node 434b-d, preferably each intermediate node 434b-d, is electrically connected to at least one of the one or more electrodes 420a-h. One or both of the end nodes 434a, e may be connected to one or more electrodes 420a-h. The end nodes 434a, e may be connected to routings 490a, b. Preferably, each electrode 420a-h is electrically connected to a node 434a-e of the potential divider. At least two electrodes 420a-h may be electrically connected to different nodes 434a-e of the potential divider. Preferably, each node 434a-e of the potential divider is electrically connected to at most two electrodes 420a-h of any one manipulator 400. In the figures, electrical connections on one of the opposing surfaces 411, 412 are shown in solid lines, whereas electrical connections on the other of the opposing surfaces 411, 412 are shown in dashed lines. At least one resistive element 432a-d is formed within the substrate 410 so as to extend between the opposing major surfaces 411, 412. An insulator 433a-d may be provided between the resistive elements 432a-d and the bulk of the substrate 410.

Provision of the potential divider may reduce the number of routings for providing appropriate voltages to the electrodes 420a-h of the manipulator 400. For example, with reference to FIG. 4a, without the potential divider a micro-deflector with eight (8) electrodes 420a-h requires up to eight (8) individual routings for providing different voltages to the electrodes 420a-h. With the potential divider, only two (2) routings 490a, b may be required, with one routing providing the greatest required voltage and the other routing providing the smallest required voltage. This reduces the surface area around the manipulator 400 required for routing. Because routings may be associated with one or both of the major surfaces, having fewer connections to the manipulator elements simplifies routing design. Crossing of routing would be less frequent. Routing crossing is undesirable if the manipulator is operated at high voltage in view of the risk of discharge and in view of thermal load. Forming at least one resistive element 432a-d within the substrate reduces the space required for the potential divider compared to a situation in which all resistive elements 432a-d are formed on one of the opposing major surfaces 411, 412. The manipulator 400 may thus be more compact than a manipulator without potential divider, or a manipulator with a potential divider comprising only resistive elements formed on the opposing major surfaces 411, 412. See for example EP2702595 FIGS. 5A and 5B which disclosure relating to the potential divider arrangement and as applied to a multi-pole manipulator is hereby incorporated by reference.

A shown in FIG. 4a, the potential divider may extend along one side of the manipulator 400 and comprise electrical connections to the electrodes 420a-h on both sides of the manipulator 400. Alternatively, the potential divider may extend around the entire circumference of the manipulator 400. For example, the potential divider may comprise two branches that are connected in parallel between the end nodes 434a, 434e, each branch extending on different sides of the manipulator 400. The potential divider can extend as much or as little along the perimeter of the manipulator 400 as desired, and may, for example, extend along a third, quarter, a fifth, or a smaller fraction of the perimeter of the manipulator 400. The potential divider may be electrically connected to specific electrodes only (for example to electrodes 420a, 420c, 420e, 420g), and the remaining electrodes may optionally be electrically connected to another potential divider.

Preferably, as shown in FIG. 4a, each resistive element 432a-d is formed within the substrate 410 so as to extend between the opposing major surfaces 411, 412. This may further reduce the space required for the potential divider compared to a situation in which some of the resistive elements 432a-d are formed on one of the opposing major surfaces 411, 412. In some embodiments, at least two resistive element 432a-d, at least four (4) resistive elements 432a-d, at least eight (8) resistive elements 432a-d, or at least 16 resistive elements 432a-d are formed within the substrate 410.

The interconnecting surface 418 may comprise an inward surface (particularly a radially inner surface) 418a. The interconnecting surface 418 may also comprise an outward surface 418b (particularly a radially outer surface). The outward surface 418b may form a radially outer end of one or more radial recesses in the inward surface 418a. Although straight radial recesses are shown in FIG. 4a, the radial recesses may have any other shape.

The inward surface 418a, for example the entire inward surface 418a, may provide the one or more electrodes 420a-h. The interconnecting surface 418 may further comprise an insulator between adjacent electrodes 420a-h. The insulator may be provided by at least part of the outward surface 418b and/or recessed surfaces 418c between the adjacent electrodes 420a-h. Although FIG. 4a shows that the entire outward surface 418b and recessed surfaces 418c provide the insulators, at least part of the outward surface 418b and recessed surfaces 418c may provide the electrodes 420a-h. In other words, the electrodes 420a-h may extend to at least part of the recessed surfaces 418c and/or outward surface 418b.

As shown in FIG. 4a, the resistive elements 432a-d (or at least one of the resistive elements 432a-d) may be positioned distally from a central axis 415 of the through-passage 416 compared to the outward surface 418b. In other words, the resistive elements 432a-d (or at least one of the resistive elements 432a-d) may be positioned further radially outward than a depth of the radial recesses. The resistive elements 432a-d may be positioned relatively close to the manipulator 400, for example within a distance of less than 10 times, preferably less than 5 times, further preferably less than 3 times or less than 2 times, of the diameter formed by the outward surface 418b. Positioning the resistive elements 432a-d as in FIG. 4a provides space for resistors with large cross-sectional area, and thus allows for a large variation in cross-sectional area (and thus large variation in resistance) of the resistive elements 432a-d.

Figure 5A:
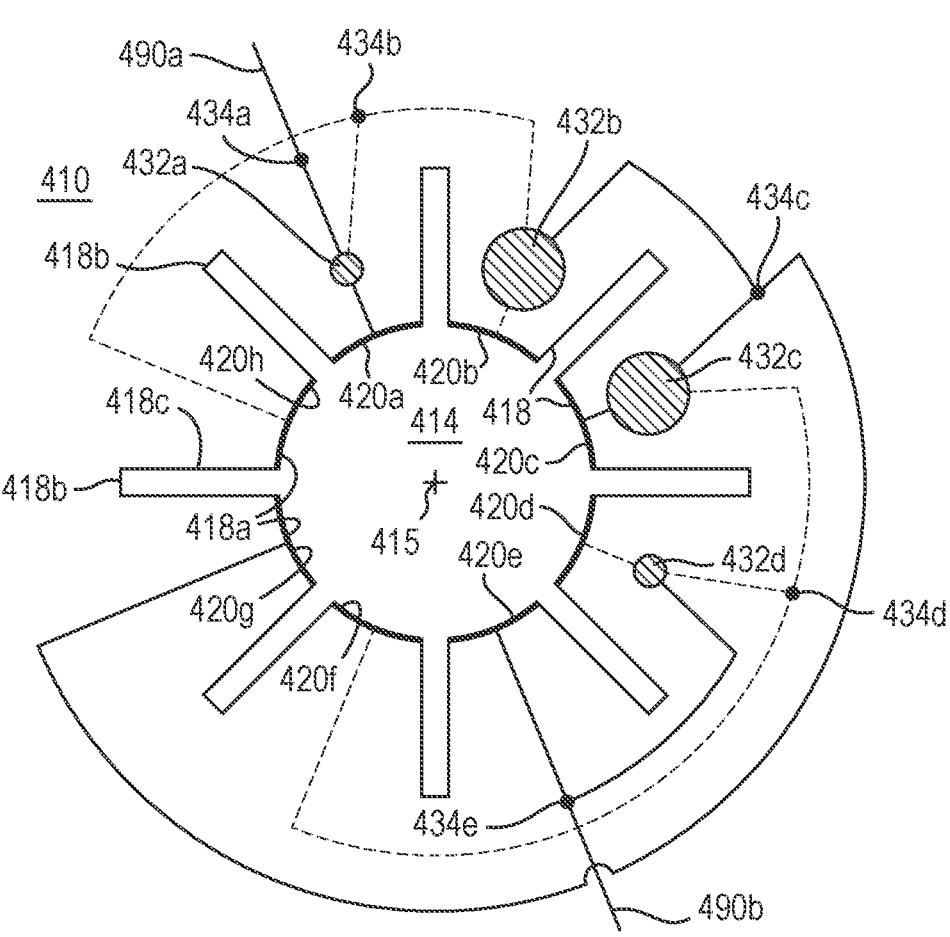
FIG. 5a schematically depicts, in plan view, a manipulator according to some embodiments of the present disclosure.

Alternatively, as shown in FIG. 5a, the resistive elements 432a-d (or at least one of the resistive elements 432a-d) may be positioned further radially inward than the outward surface 418b. In other words, the radial recesses may extend further radially outward than the resistive elements 432a-d or at least one of the resistive elements 432a-d. The resistive elements 432a-d (or at least one of the resistive elements 432a-d) may be positioned between adjoining radial recesses. The resistive elements 432a-d (or at least one of the resistive elements 432a-d) may be positioned proximate to the inward surface 418a. Such an arrangement of the resistive element 432a-d may be even more compact. The cross-sectional area of the resistive element 432a-d arranged as in FIG. 5a is, however, limited, thus limiting the variation in cross-sectional area (and thus the variation in resistance) of the resistive elements 432a-d.

Figure 5B:
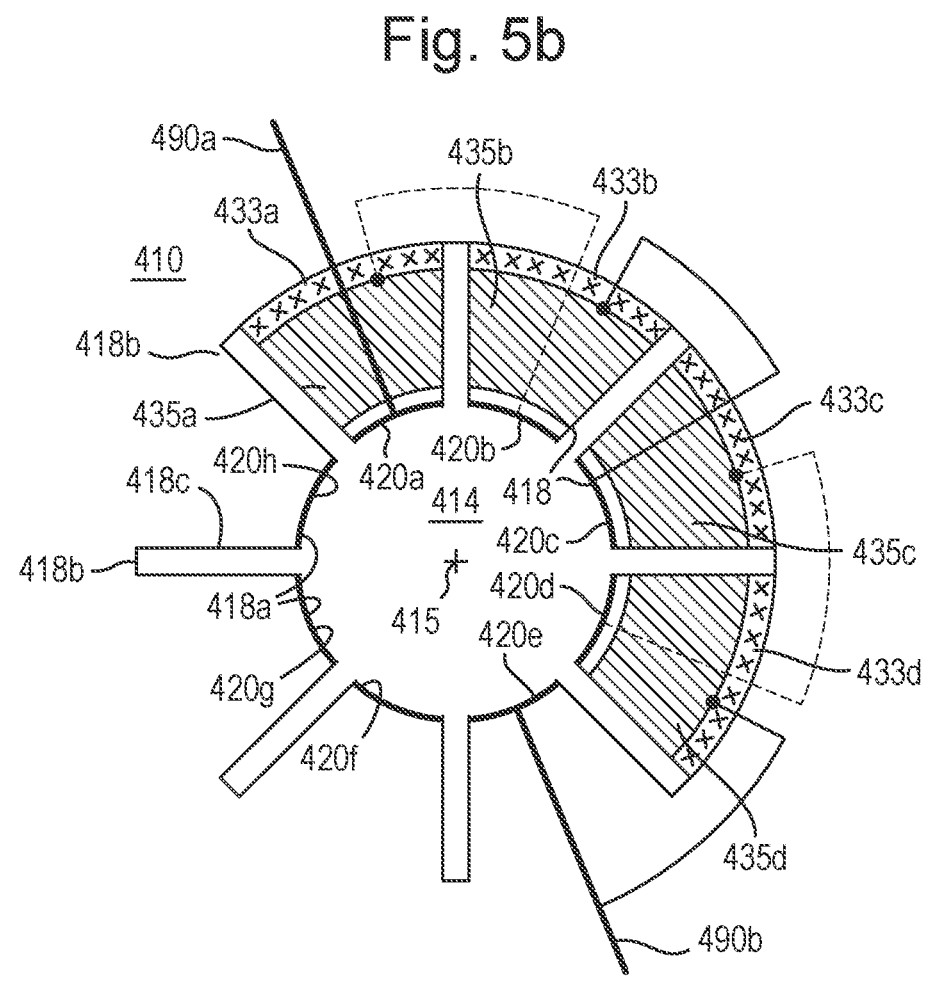

As schematically shown in FIG. 5b, the resistive elements 432a-d (or at least one of the resistive elements 432a-d) may be substantially the portion of the substrate 410, as shown as elements 435a-d, between the outward surface 418b and the inward surface 418a. The resistive elements 435a-d may be made from the same material as the bulk of the substrate 410 or may be doped or otherwise adjusted compared to the bulk of the substrate 410. The resistive elements 435a-d (or at least one of the resistive elements 435a-d) may extend between adjacent radial recesses. An insulator 433a-d may be provided between the resistive elements 435a-d and the bulk of the substrate 410. The insulator 433a-d may extend between adjacent radial recesses. The electrodes 420a-h may comprise a conductive coating on the resistive elements 435a-d. An insulator may be provided between the resistive elements 435a-d and the electrodes 420a-h. The arrangement of FIG. 5b maximizes the possible cross-sectional area of the resistive elements 435a-d while providing the resistive elements 435a-d within the outward surface 418b.

Figure 5C:
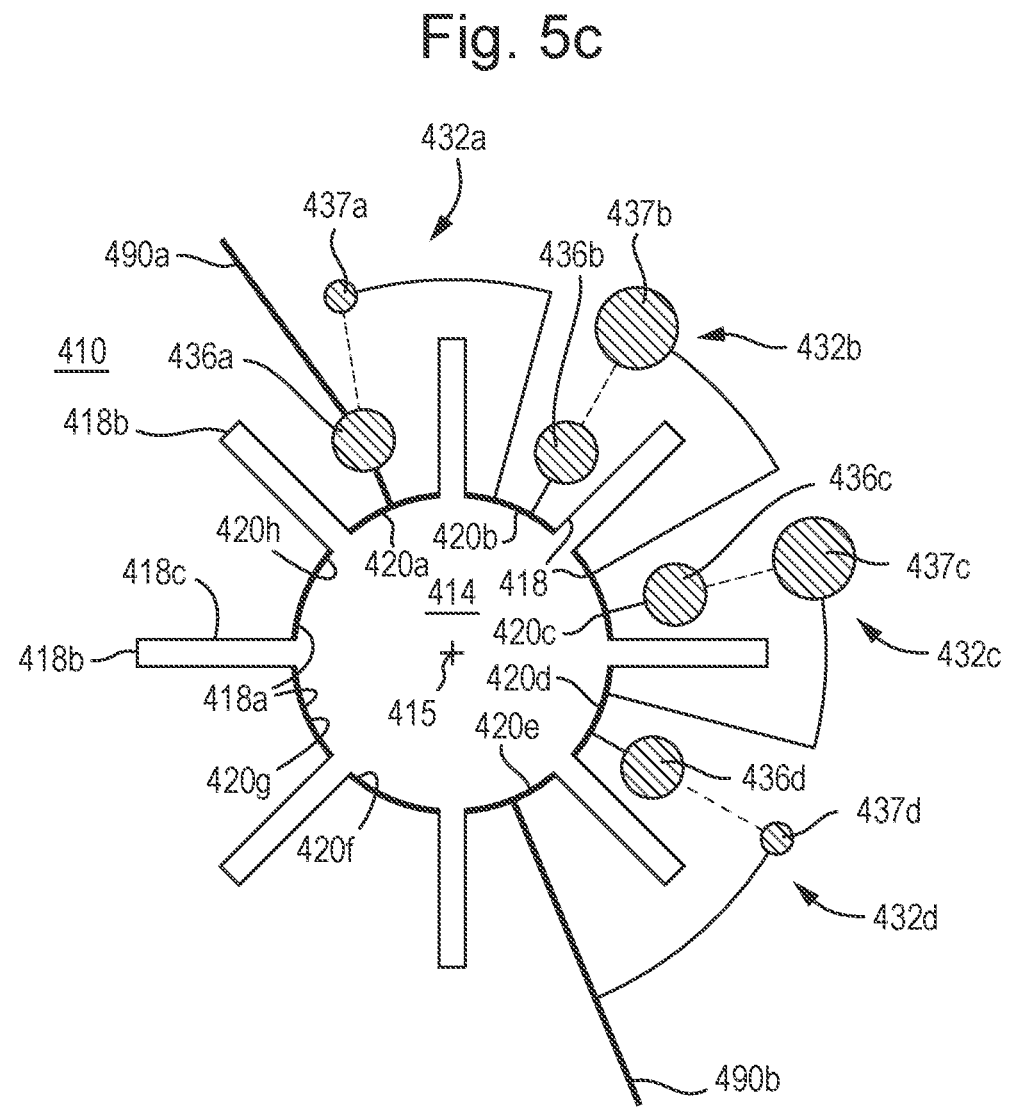

As shown in FIG. 5c, the resistive elements 432a-d (or at least one of the resistive elements 432a-d) may comprise an inner portion 436a-d and an outer portion 437a-d. The inner portion 436a-d may be positioned radially inward compared to the outward surface 418b. The inner portion 436a-d may be positioned as described in relation to the resistive elements 432a-d of FIG. 5a. In an arrangement, the inner portion 436a-d may be taking the form of the resistive elements 435a-d as shown in FIG. 5b. The outer portion 437a-d may be positioned radially outward compared to the outward surface 418b. The outer portion 437a-d may be positioned as described in relation to the resistive elements 432a-d of FIG. 4a. The inner portion 436a-d and corresponding outer portion 437a-d of each resistive element 432a-d or some resistive elements 432a-d may be electrically connected in series, as shown in FIG. 5c. Thus inner and outer portions 436a-d, 437a-d are effectively a single resistive element in the potential divider. Such a serial arrangement may permit the resistance of the resistive element to be increased compared to a situation in which a serial arrangement is not used. A larger resistance of the resistive element may decrease the current through (and thus power dissipated by) the resistive element for any given applied voltage. Alternatively, the inner portion 436a-d and corresponding outer portion 437a-d of each resistive element 432a-d or some resistive elements 432a-d may be electrically connected in parallel (not shown). This arrangement allows for the resistance of the resistive element to be reduced compared to the arrangement in which the portions are connected in series. This may be beneficial in some circumstances, for example when a relatively small voltage drop between two intermediate nodes of the potential divider is desired to achieve a particular voltage distribution. In an arrangement, some of the resistive elements may comprise portions connected in series and others of the resistive elements may comprise portions connected in parallel.

As shown in FIG. 5c, in a plane parallel to one of the opposing major surfaces 411, 412, the cross-sectional area of the inner portions 436a-d, or the cross-sectional area of at least two of the inner portions 436a-d, may be substantially equal. The cross-sectional area of the outer portions 437a-d or of at least two outer portions 437a-d may differ. This may allow the resistance of each resistive element 432a-d to be set by appropriately forming the cross-sectional area of the outer portions 437a-d.

FIGS. 4a and 5a-5c show different manners of positioning and forming the resistive elements 432a-d within the substrate. The manipulator 400 may comprise any combination of resistive elements 432a-d, 435a-d, 436a-d, 437a-d in FIGS. 4a and 5a-5c. For example, the manipulator 400 may optionally comprise some resistive elements 432a-d that are further radially outward than a depth of the radial recesses (as in FIG. 4a). Additionally or alternatively, the manipulator 400 may optionally comprise some resistive elements 432a-d that are further radially inward than a depth of the radial recesses (as in FIG. 5a). Additionally or alternatively, the manipulator 400 may optionally comprise some resistive elements 435a-d that form substantially the portion of the substrate 410 between the outward surface 418b and the inward surface 418a (as in FIG. 5b). Additionally or alternatively, the manipulator 400 may optionally comprise some resistive elements 432a-d that comprise the inner portion 436a-d and the outer portion 437a-d (as in FIG. 5c).

As shown in FIGS. 4a, 5a and 5c, in a plane parallel to the opposing major surfaces 411, 412, a cross-section of the resistive elements 432a-d may comprise a circular cross-section. A circular cross-section may be easier to manufacture than other cross-sections. However, the cross-section of the resistive elements 432a-d may also comprise any other shape. For example, the cross-section of the resistive elements 432a-d may comprise an angular cross-section, such as a square or rectangular or other polygonal cross section, or an elliptical cross-section.

As shown in FIG. 4b, the cross-section of the resistive elements 432a-d in FIG. 4a may be substantially constant. As such, when the cross-section is circular, the resistive elements 432a-d may be formed as cylinders. Alternatively, the cross-section of each resistive element 432a-d may vary along the length of the resistive element 432a-d (in a direction perpendicular to the opposing major surfaces 411, 412) in size and/or shape. For example, the resistive elements 432a-d may be tapered towards one of the opposing major surfaces 411, 412. This may make fabrication of the resistive elements 432a-d easier. For example, when the cross-section is circular, the resistive elements 432a-d may be formed as a cone frustum.

As shown in FIG. 4a, in a plane parallel to the opposing major surfaces 411, 412 of the substrate 410, cross-sections of the resistive elements 432a-d may have different areas. The cross-sectional area of the resistive elements 432a-d may vary, such that at least some resistive elements 432a-d have a different cross-sectional area than other resistive elements 432a-d. Because the cross-sectional area of the resistive elements 432a-d contributes to the resistance of the resistive elements 432a-d, the provision of different cross-sectional areas allows different resistive elements 432a-d to have different resistances. The different resistances in the potential divider allow design of the voltage distribution of the potential divider.

The distribution of resistances, from an end node of the potential divider to the intermediate nodes of the potential divider, may be a substantially sinusoidal distribution around at least a portion of the manipulator around the beam path. For example, this distribution of resistances may be within 20%, preferably within 10% or within 5% or 1%, of a sinusoidal curve. Because the voltage distribution in a potential divider 230 is proportionate to the distribution of resistances, the voltage distribution may thus be substantially sinusoidal. Applying a sinusoidal voltage distribution to the electrodes 432a-d of the manipulator 400 (in particular of a micro-deflector) achieves a substantially uniform E-field in the through-passage 416 of the manipulator 400. Provision of a uniform E-field (as opposed to a non-uniform E-field) may reduce aberrations in a charged particle beam passing through the E-field. EP2702595 shows in FIGS. 3 and 4 how the sinusoidal voltage distribution achieves a substantially uniform E-field, and the disclosure thereof is hereby incorporated by reference.

The resistive elements 432a-d, for example each or at least one of the resistive elements 432a-d, may be formed as through-silicon vias (TSVs). This may be achieved by an etch and diffusion process, such as the process of US 2007/0020926 A, which disclosure especially in relation to the manufacturing process is incorporated by reference.

Figure 6:
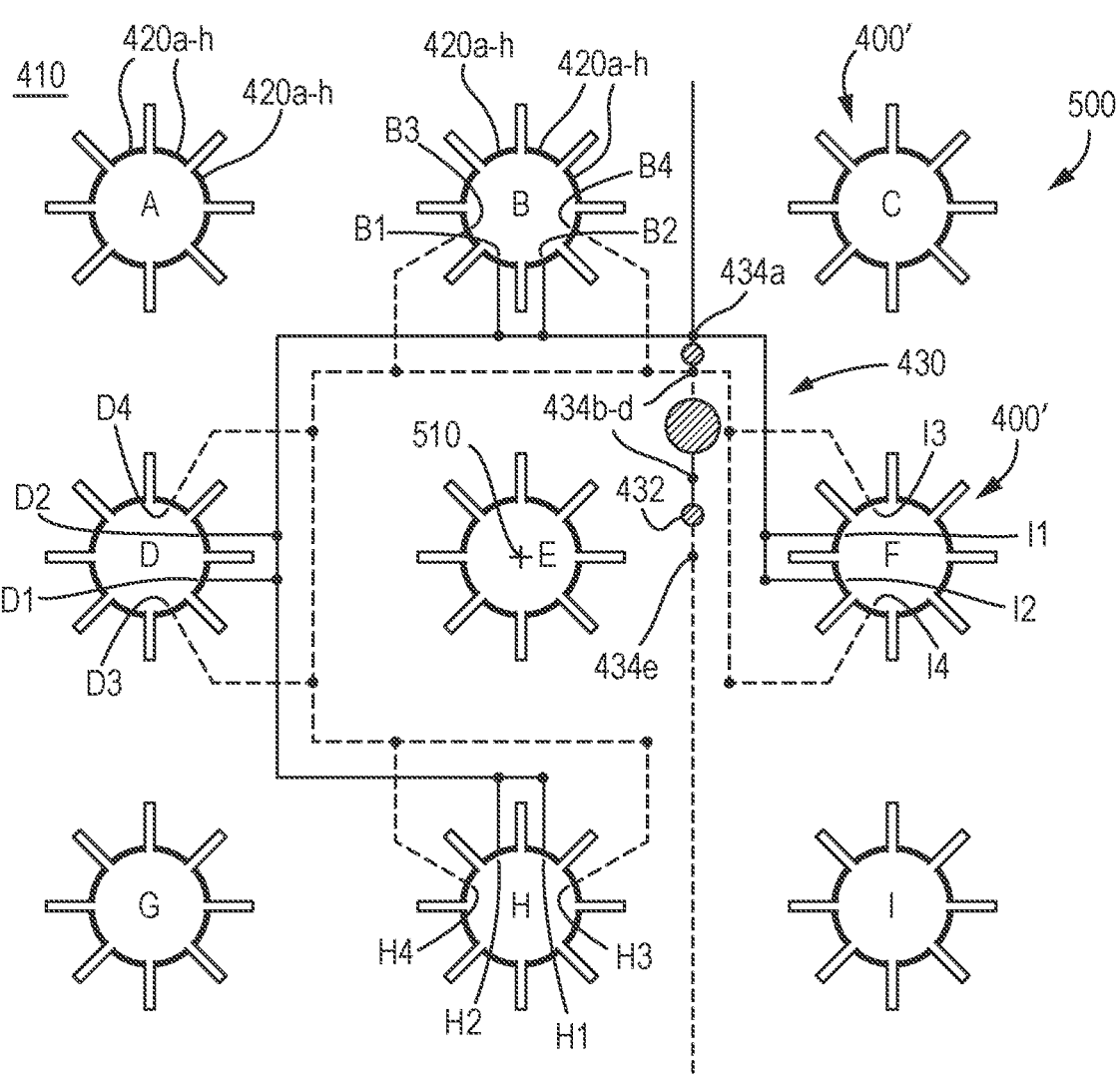
FIG. 6 schematically depicts a manipulator array according to some embodiments of the present disclosure.

As shown in FIG. 6, an array of apertures may be defined in each of the opposing major surfaces 411, 412. The substrate 410 may comprise an array of through-passages 416. Each through-passage 416 may have a respective interconnecting surface 418 extending between the respective apertures 413, 414. Each of the interconnecting surfaces 418 may be shaped as described in connection with FIGS. 4a, 4b and 5a-c. Each interconnecting surface 418 comprises at least one electrode 420a-h.

FIG. 6 thus schematically depicts a manipulator array 500. The manipulator array 500 may be for manipulating the path of a charged particle multi-beam, such as the multi-beam of FIGS. 2 and 3. The manipulator array 500 may be the aberration compensator array 324 (e.g. a micro-lens array and/or micro-stigmator array), the pre-bending micro-deflector array 323 or the image forming array 322 (i.e. a micro-deflector array) of FIG. 3. The manipulator array 500 is not limited to a manipulator array of the dimensions, function and elements as depicted in FIGS. 2 and 3. The manipulator array may be any array of manipulators in an electron-optical design.

The manipulator array 500 comprises an array of manipulators 400'. Each manipulator 400' may in essence correspond to the manipulator 400 described in connection with FIGS. 4a, 4b and 5a-c. The manipulators 400' may be provided in a common substrate 410. The substrate may have opposing major surfaces 411, 412. Each manipulator 400' may define in the substrate 410 an aperture 413, 414 and a through-passage 416 having an interconnecting surface extending between the respective apertures 413, 414.

FIG. 6 shows a 3×3 square array of manipulators 400'. However, any other number of manipulators 400' may be provided as part of the manipulator array 500. The manipulator array 500 may comprise at least nine manipulators 400', preferably at least 16 or at least 25 manipulators 400', further preferably at least 36, 49, or 64 manipulators 400'. The manipulator array 500 may comprise many more manipulators 400', for example 10,000 or more manipulators 400'. The array need not be a square array. The array may have any regular repeating structure. The manipulators 400' may be arranged in the regular repeating structure. For example, the array may be a hexagonal array, preferably a regular hexagonal array. This may allow the manipulators 400' to be packed more closely compared to a rectangular array. Alternatively, the manipulator array 500 may be an irregular array. For example, the manipulators 400' may be arranged in an irregular square shape, such as a rhombic or parallelo-gramic pattern, or in an irregular hexagon.

The manipulator array 500 may comprise a midpoint 510. The midpoint 510 may be alignable with a central beam path of the multi-beam. For example, the midpoint 510 may be alignable with an intended electron-optical path, such as a primary electron optical path of a primary electron-optical system which may be the primary optical axis of the charged particle inspection tool 200, 300 of FIG. 2 or 3. The midpoint 510 may thus be an electro-optical midpoint.

Each manipulator 400' in the manipulator array 500 may have a dedicated potential divider. For each through-passage 416, there may be provided the corresponding potential divider. If the manipulator associated with a through passage is a multipole device such as a deflector or stigmator, the applied potential may have a potential divider to distribute the potential to the constituent electrodes of the multipole device. Each manipulator 400' may thus comprise a potential divider as described in relation to FIGS. 4a-b and 5a-c.

Alternatively or additionally, at least two manipulators 400' may share a common potential divider 430. Optionally, the at least two manipulators 400' that share a common potential divider 430 may be arranged in a pattern with respect to the manipulator array 500. For example, the at least two manipulators 400' that share a common potential divider may be arranged in a square (e.g. in a square array 500 of manipulators 400') or in a hexagon (e.g. in a hex-agonal array 500 of manipulators 400'). That is, the pattern may have a repeating shape such a square or hexagon and two or more of the manipulators of the pattern may share a common potential divider. For example, the pattern may be a series of concentric shapes around a mid-point of the array. The manipulators along one side of a shape in the concentric pattern may be connected to a common potential divider. Each of at least one intermediate node 434b-d of the common potential divider 430 may be connected to at least two electrodes 420, each of the at least two electrodes 420 forming part of a different manipulator 400'. An intermediate node 434b-d of the common potential divider 230 may thus be connected to multiple electrodes comprised by the inter-connecting surface of different through-passages 416. Pref-erably, each electrode 420 of at least two manipulators 400' is electrically connected to one of the nodes 434a-e of the common potential divider 430. As such, all electrodes 420 of at least two manipulators 400' share a common potential divider 430. The common potential divider 430 may corre-spond to the potential divider described in relation to FIGS. 4a-b and 5a-c, with at least one of the nodes 434b-d connected to electrodes 420 of two or more manipulators 400'.

Alternatively or additionally, the common potential divider 430 may be common to all manipulators 400' in the manipulator array 500. In other words, each of at least one intermediate node 434b-d of the common potential divider 430 may be connected to at least one electrode 420 of each manipulator 400' in the manipulator array 500. Each elec-trode 420 of each manipulator 400' in the manipulator array 500 may be connected to one of the nodes 434a-e of the common potential divider 430.

Alternatively or additionally, multiple common potential dividers 430 may be provided. Each common potential divider 430 may be common to a subset of all manipulators 400' in the manipulator array 500. In an arrangement, each of at least one intermediate node 434b-d of the common potential divider 430 may be connected to at least one electrode 420 of each manipulator 400' in the subset. Each electrode 420 of each manipulator 400' in the subset may be connected to one of the nodes 434a-e of the common potential divider 430. For example, each common potential divider 430 may be common to a number of manipulators 400' that is in the range from 2 to 32, preferably from 2 to 16, further preferably from 4 to 8. The ratio of the number of manipulators 400' in the manipulator array 500 to the number of common potential dividers 430 may be in the range from 2 to 32, preferably from 2 to 16, further preferably from 4 to 8. Alternatively, each common potential divider 430 may be common to a much larger number of manipulators 400', for example to 100, 1000, 10,000 or more manipulators 400'.

The electrodes 420 comprised by the interconnecting surface 418 of the through-passages 416 that are located an equal distance from the midpoint 510 may have a common connection to the potential divider 230, i.e. share the common potential divider 230. The manipulators 400' that are located a substantially equal distance from the midpoint 510 may form the subset of manipulators 400' that share a common potential divider 430. For example, with reference to FIG. 6 showing manipulators in a square arrangement, the manipulators 400' A, C, G and I are located an equal distance from the midpoint 510 and so may share a common potential divider 230. The manipulators 400' B, D, F and H are also located an equal distance from the midpoint 510 and so may share a common potential divider 230. In particular, each node 434a-e of the common potential divider 230 may be connected to those electrodes 420 of the manipulators 400' in the subset that have the same orientation along the respective interconnecting surfaces 418 relative to the midpoint 510.

With reference to FIG. 6, the electrodes B1, D1, F1 and H1 have the same orientation along their respective interconnecting surfaces relative to the midpoint 510, and so are connected to the same node of the common potential divider. Similarly, electrodes B2, D2, F2, H2, electrodes B3, D3, F3, H3 and electrodes B4, D4, F4, H4 respectively have the same orientation along their respective interconnecting surfaces relative to the midpoint 510, and so are connected to the same node of the common potential divider 230. The connections from the remaining nodes of the common potential divider 430 to the remaining electrodes of manipulators 400' B, D, F, H are not shown in FIG. 6 solely for reasons of clarity but may be present in the example. A similar arrangement is envisaged in which the manipulators are arranged in a hexagonal pattern, or in an irregular square, e.g. rhombic or parallelogramic, pattern. The manipulators 400' that are located an equal distance from the midpoint 510 may thus manipulate the path of the charged particle beam in a similar manner. For example, for manipulators 400' that are micro-deflectors, it may be desirable to deflect the paths of the beamlets 212, 213 that are equally displaced from the midpoint 510 by the same amount. Because the paths of the beamlets 212, 213 are deflected by the same amount, some or all of the manipulators 400' that manipulate the paths of these beamlets may share a common potential divider 230.

Each common potential divider may thus be common to four (4) manipulators 400' for a manipulator array 500 in a square arrangement. The ratio of the number of manipulators 400' in the manipulator array 500 to the number of common potential dividers 430 may be four (4) manipulators 400' for a manipulator array 500 in a square arrangement. This is because an array having a square grid arrangement comprises groups of four manipulators 400' that are located at an equal distance relative to a midpoint of the manipulator array 500 (so each group of such four manipulators 400' may manipulate the path of a respective charged particle sub-beam in the same manner with respect to the midpoint, preferably the electron-optical axis).

Each common potential divider 230 may be common to six (6) manipulators 400' for a manipulator array 500 in a hexagonal arrangement. The ratio of the number of manipulators 400' in the manipulator array 500 to the number of common potential dividers 430 may be six (6) manipulators 400' for a manipulator array 500 in a hexagonal arrangement. An array having the manipulators arranged in a hexagonal grid comprises groups of six manipulators 400' that are located at an equal distance from a midpoint of the manipulator array 500 and may operate on corresponding sub-beams in the same manner with respect to the midpoint, preferably the electron-optical axis.

Any combination of the above-described arrangements of potential dividers 430 and manipulators 400' in the manipulator array 500 is possible. For example, each manipulator 400' in the manipulator array 500, or each manipulator 400' of a subset of the manipulators 400' in the manipulator array 500, may share a common potential divider and at the same time be electrically connected to an individual potential divider. In some circumstances, the common potential divider 430 may be used to apply relatively large voltages to the electrodes 420 of the manipulators 400' (so as to have a relatively large effect on the path of the respective beamlet), i.e. coarse control. The individual potential divider may be used to apply relatively small voltages to the electrodes 420 of the manipulators 400' (so as to have a relatively small, corrective effect on the path of the respective beamlet), i.e. fine control.

In some embodiments, there is provided the manipulator 400 for manipulating a charged particle beam in an electron-optical projection system. The manipulator 400 comprises the substrate 410 having major surfaces 411, 412 in each of which is defined an aperture 413, 414 and a through-passage 416 having an interconnecting surface 418 extending between the apertures 413, 414. The interconnecting surface 418 comprises electrodes 420a-h arranged around the aperture 413, 414. The manipulator comprises the potential divider comprising two or more resistive elements 432a-d in electrical series between two electrodes 420a-h, the potential divider being configured to distribute an applied voltage over the electrodes 420a-h. At least one of the resistive elements 432a-d extends within the substrate 410 between the opposing major surfaces 411, 412. An intermediate node between adjoining resistive elements 432a-d may be electrically connected to at least one of the electrodes 420a-h.

In some embodiments, there is provided a charged particle tool comprising an illumination system configured to generate a charged particle beam, and a projection system configured to directing the charged particle beam onto the sample 208. The projection system comprises the manipulator 400 or the manipulator array 500.

In some embodiments, there is provided a multi-beam charged particle tool comprising an illumination system configured to generate a charged particle beam, and a projection system configured to convert the charged particle beam into a multi-beam and to directing the multi-beam onto a sample 208. The projection system comprises the manipulator 400 or the manipulator array 500.

In some embodiments, there is provided a method of manipulating a charged particle beam using the manipulator 400, the manipulator array 500, the charged particle tool 40 or the multi-beam charged particle tool 40.

While the embodiments of the present disclosure have been described in connection with various examples, other embodiments will be apparent to those skilled in the art from consideration of the specification and practice of the technology disclosed herein. It is intended that the specification and examples be considered as exemplary only, with a true scope and spirit of the invention being indicated by the following claims. Reference to inspection throughout this specification is intended also to refer to measurement, i.e. metrological applications.

The descriptions above are intended to be illustrative, not limiting. Thus, it will be apparent to one skilled in the art that modifications may be made as described without departing from the scope of the claims set out below.

An embodiment may be defined by one or more of the following clauses:

Clause 1: A manipulator for manipulating a charged particle beam in a projection system, the manipulator comprising: a substrate having opposing major surfaces in each of which is defined an aperture and a through-passage having an interconnecting surface extending between the apertures; wherein the interconnecting surface comprises one or more electrodes; the manipulator further comprising a potential divider comprising two or more resistive elements connected in series, the potential divider comprising an intermediate node between each pair of adjacent resistive elements, wherein at least one resistive element is formed within the substrate so as to extend between the opposing major surfaces; wherein the intermediate node is electrically connected to at least one of the one or more electrodes.

Clause 2: The manipulator of clause 1, wherein each resistive element is formed within the substrate so as to extend between the opposing major surfaces.

Clause 3: The manipulator of clause 1 or 2, wherein the interconnecting surface comprises an inward surface providing the one or more electrodes; an outward surface forming a radially outer end of one or more radial recesses in the inward surface.

Clause 4: The manipulator of clause 3, wherein the interconnecting surface comprises an insulator between adjacent electrodes, the insulator provided by at least part of the outward and/or recessed surfaces between the adjacent electrodes.

Clause 5: The manipulator of clause 3 or 4, wherein at least one of the resistive elements is positioned distally from a central axis of the through-passage compared to the outward surface.

Clause 6: The manipulator of any one of clauses 3 to 5, wherein the two or more resistive elements are positioned further radially outward than a depth of the radial recesses.

Clause 7: The manipulator of any one of clauses 3 to 6, wherein at least one of the resistive elements is positioned further radially inward than the outward surface.

Clause 8: The manipulator of any one of clauses 3 to 7, wherein the radial recesses extend further radially outward than at least one of the resistive elements.

Clause 9: The manipulator of any one of clauses 3 to 8, where at least one of the resistive elements are positioned between adjoining recesses.

Clause 10: The manipulator of any one of clauses 3 to 9, wherein at least one of the resistive elements is substantially the portion of the substrate between the outward surface and the inward surface.

Clause 11: The manipulator of any one or clauses 3 to 10, wherein at least one of the two or more resistive elements comprises an inner portion that is positioned radially inward compared to the outward surface, and an outer portion that is positioned radially outward compared to the outward surface.

Clause 12: The manipulator of clause 11, wherein, in a plane parallel to one of the opposing major surfaces, a cross-sectional area of at least two of the inner portions is substantially equal.

Clause 13: The manipulator of clause 11 or 12, wherein, in a plane parallel to one of the opposing major surfaces, a cross-sectional area of at least two outer portions differs.

Clause 14: The manipulator of any one of clauses 11 to 13, wherein the inner portion and the outer portion of each resistive element are connected in series or in parallel.

Clause 15: The manipulator of any one of clauses 1 to 14, wherein, in a plane parallel to the opposing major surfaces of the substrate, cross-sections of the resistive elements have different areas, such that the resistive elements have different resistances.

Clause 16: The manipulator of any one of clauses 1 to 15, wherein, in a plane parallel to the opposing major surfaces of the substrate, a cross-section, of at least one of the two or more resistive elements comprises a circular cross-section.

Clause 17: The manipulator of any one of clauses 1 to 16, wherein at least one resistive element within the substrate is formed as a cylinder or a cone frustum.

Clause 18: The manipulator of any one of clauses 1 to 17, wherein at least one resistive element within the substrate is formed as through silicon via.

Clause 19: The manipulator of any one of clauses 1 to 18, wherein the distribution of resistances, from an end node of the potential divider to the intermediate nodes of the potential divider, is a substantially sinusoidal distribution.

Clause 20: The manipulator of any one of clauses 1 to 19, wherein the interconnecting surface comprises a plurality of electrodes, adjacent electrodes being electrically isolated from each other, wherein each electrode is electrically connected to a node of the potential divider.

Clause 21: The manipulator of any one of clauses 1 to 20, wherein at least two electrodes are electrically connected to different nodes of the potential divider.

Clause 22: The manipulator of any one of clauses 1 to 21, wherein the interconnecting surface comprises a number of electrodes that is a multiple of four.

Clause 23: The manipulator of clause 22, wherein the interconnecting surface comprises at least four electrodes, preferably at least eight electrodes.

Clause 24: The manipulator of any one of clauses 1 to 13, wherein each of the plurality of electrodes extends between the opposing major surfaces of the substrate.

Clause 25: The manipulator of any one of clauses 1 to 24, wherein the manipulator is a deflector configured to deflect a charged particle beam path relative to a central axis of the through-passage.

Clause 26: The manipulator of any one of clauses 1 to 25, wherein an array of apertures is defined in each of the opposing major surfaces, and wherein the substrate comprises an array of through-passages, each through-passage having a respective interconnecting surface extending between the respective apertures, wherein each interconnecting surface comprises at least one electrode.

Clause 27: The manipulator of clause 26, wherein, for each through-passage: the manipulator comprises a potential divider comprising two or more resistive elements connected in series, the potential divider comprising an intermediate node between each pair of adjacent resistive elements, wherein at least one resistive element is formed within the substrate so as to extend between the opposing major surfaces of the substrate; wherein the intermediate node is electrically connected to at least one of the plurality of electrodes.

Clause 28: The manipulator of clause 26 or 27, wherein the intermediate node is connected to multiple electrodes comprised by the interconnecting surface of different through-passages.

Clause 29: The manipulator of any one of clauses 26 to 28, wherein the array has a regular repeating structure, such as a rectangular array or a hexagonal array.

Clause 30: The manipulator of any one of clauses 26 to 29, the array comprising a midpoint which is alignable with a central beam path of the multi-beam, wherein the electrodes comprised by the interconnecting surface of the through-passages that are located an equal distance from the midpoint have a common connection to the potential divider.

Clause 31: A manipulator for manipulating a charged particle beam in an electron-optical projection system, the manipulator comprising: a substrate having major surfaces in each of which is defined an aperture and a through-passage having an interconnecting surface extending between the apertures and comprising electrodes arranged around the aperture; a potential divider comprising two or more resistive elements in electrical series between two electrodes, the potential divider being configured to distribute an applied voltage over the electrodes, wherein at least one of the resistive elements extends within the substrate between the opposing major surfaces.

Clause 32: The manipulator of clause 31, wherein an intermediate node between adjoining resistive elements is electrically connected to at least one of electrodes.

Clause 33: A manipulator array for manipulating a charged particle multi-beam, the manipulator array comprising an array of manipulators provided in a substrate having opposing major surfaces, each manipulator defining in the substrate an aperture and a through-passage having an interconnecting surface extending between the respective apertures; wherein each interconnecting surface comprises one or more electrodes; each manipulator further comprising a potential divider comprising two or more resistive elements connected in series, the potential divider comprising an intermediate node between each pair of adjacent resistive elements, wherein at least one resistive element is formed within the substrate so as to extend between the opposing major surfaces of the substrate; wherein the intermediate node is electrically connected to at least one of the one or more electrodes.

Clause 34: A charged particle tool comprising: an illumination system configured to generate a charged particle beam, and a projection system configured to directing the charged particle beam onto a sample, wherein the projection system comprises the manipulator of any one of clauses 1 to 32 or the manipulator array of clause 33.

Clause 35: A multi-beam charged particle tool comprising: an illumination system configured to generate a charged particle beam, and a projection system configured to convert the charged particle beam into a multi-beam and to directing the multi-beam onto a sample, wherein the projection system comprises the manipulator of any one of clauses 26 to 32 or the manipulator array of clause 33.

Clause 36: A method of manipulating a charged particle beam using the manipulator of any one of clauses 1 to 32, the manipulator array of clause 33, the charged particle tool of clause 34 or the multi-beam charged particle tool of clause 35.

The invention claimed is:

1. A manipulator for manipulating a charged particle beam in a projection system, the manipulator comprising:
a substrate having opposing major surfaces in each of which is defined an aperture and a through-passage having an interconnecting surface extending between the apertures;
wherein the interconnecting surface comprises one or more electrodes;
the manipulator further comprising a potential divider comprising two or more resistive elements connected in series, the potential divider comprising an intermediate node between each pair of adjacent resistive elements, wherein at least one resistive element is formed within the substrate so as to extend between the opposing major surfaces;
wherein the intermediate node is electrically connected to at least one of the one or more electrodes.

2. The manipulator of claim 1, wherein each resistive element is formed within the substrate so as to extend between the opposing major surfaces.

3. The manipulator of claim 1, wherein the interconnecting surface comprises: an inward surface providing the one or more electrodes; and an outward surface forming a radially outer end of one or more radial recesses in the inward surface.

4. The manipulator of claim 3, wherein the one or more electrodes have adjacent electrodes and the interconnecting surface comprises an insulator between the adjacent electrodes, the insulator provided by at least part of outward and/or recessed surfaces between the adjacent electrodes; and/or
wherein at least one of the resistive elements is positioned distally from a central axis of the through-passage compared to the outward surface; and/or
wherein the two or more resistive elements are positioned further radially outward than a depth of the one or more radial recesses; and/or
wherein at least one of the resistive elements is positioned further radially inward than the outward surface; and/or
wherein the one or more radial recesses extend further radially outward than at least one of the resistive elements; and/or
wherein the one or more radial recesses have adjoining radial recesses and at least one of the resistive elements are positioned between the adjoining radial recesses; and/or
wherein at least one of the resistive elements is a portion of the substrate that is radially inward from the outward surface and radially outward from the inward surface; and/or
wherein each of the one or more electrodes extends between the opposing major surfaces of the substrate.

5. The manipulator of claim 3, wherein at least one of the two or more resistive elements comprises an inner portion that is positioned radially inward compared to the outward surface, and an outer portion that is positioned radially outward compared to the outward surface.

6. The manipulator of claim 3,
wherein at least two of the two or more resistive elements comprise inner portions positioned radially inward from the outward surface and outer portions positioned radially outward from the outward surface and, in a plane parallel to one of the opposing major surfaces, a cross-sectional area of at least two of the inner portions is substantially equal; and/or wherein, in a plane parallel to one of the opposing major surfaces, a cross-sectional area of at least two outer portions differs; and/or wherein the inner portion and the outer portion of each resistive element are connected in series or in parallel.

7. The manipulator of claim 1, wherein, in a plane parallel to the opposing major surfaces of the substrate, cross-sections of the resistive elements have different areas, such that the resistive elements have different resistances; and/or wherein, in a plane parallel to the opposing major surfaces of the substrate, a cross-section, of at least one of the two or more resistive elements comprises a circular cross-section; and/or wherein at least one resistive element within the substrate is formed as a cylinder or a cone frustum; and/or wherein at least one resistive element within the substrate is formed as a through silicon via; and/or wherein a distribution of resistances, from an end node of the potential divider to intermediate nodes between pairs of adjacent resistive elements of the potential divider, is a substantially sinusoidal distribution; and/or wherein the interconnecting surface comprises a plurality of electrodes, adjacent electrodes of the plurality of electrodes being electrically isolated from each other, wherein each electrode of the plurality of electrodes is electrically connected to a node of the potential divider;

and/or wherein the one or more electrodes have at least two electrodes electrically connected to different intermediate nodes between pairs of adjacent resistive elements of the potential divider.

8. The manipulator of claim 1, wherein the interconnecting surface comprises a number of electrodes that is a multiple of four.

9. The manipulator of claim 1, wherein each of the one or more electrodes extends between the opposing major surfaces of the substrate.

10. The manipulator of claim 1, wherein the manipulator is a deflector configured to deflect a charged particle beam path relative to a central axis of the through-passage.

11. The manipulator of claim 1, wherein an array of apertures is defined in each of the opposing major surfaces, and wherein the substrate comprises an array of through-passages, each through-passage having a respective interconnecting surface extending between the respective apertures, wherein each interconnecting surface comprises at least one electrode.

12. The manipulator of claim 11, wherein, for each through-passage: the manipulator comprises a potential divider comprising two or more resistive elements connected in series, the potential divider comprising an intermediate node between each pair of adjacent resistive elements, wherein at least one resistive element is formed within the substrate so as to extend between the opposing major surfaces of the substrate; wherein the intermediate node is electrically connected to at least one of the one or more electrodes.

13. The manipulator of claim 11, wherein the intermediate node is connected to multiple electrodes comprised by the respective interconnecting surface of different through-passages.

14. The manipulator of claim 11, wherein the array of apertures of each of the opposing major surfaces has a regular repeating structure.

15. The manipulator of claim 11, the array comprising a midpoint which is alignable with a central beam path of a multi-beam, wherein the electrodes comprised by respective interconnecting surface of through-passages that are located an equal distance from the midpoint have a common connection to the potential divider.

16. A charged particle tool comprising:
an illumination system configured to generate a charged particle beam, and
a projection system configured to direct the charged particle beam onto a sample, wherein the projection system comprises the manipulator of claim 1.

17. The charged particle tool of claim 16, further comprising a controller configured to apply a voltage to the one or more electrodes of the manipulator.

18. A manipulator for manipulating a charged particle beam in an electron-optical projection system, the manipulator comprising:
a substrate having major surfaces in each of which is defined an aperture, wherein a through-passage having an interconnecting surface extends between the apertures of the major surfaces, and wherein the interconnecting surface comprises electrodes;
a potential divider comprising two or more resistive elements in electrical series between two of the electrodes, the potential divider being configured to distribute an applied voltage over the electrodes,
wherein at least one of the resistive elements extends within the substrate between the major surfaces.

19. The manipulator of claim 18, wherein the two or more resistive elements have adjoining resistive elements and an intermediate node between the adjoining resistive elements is electrically connected to at least one of the electrodes.

20. A manipulator array for manipulating a charged particle multi-beam, the manipulator array comprising:
manipulators provided in a substrate having opposing major surfaces, wherein each of the manipulators is defined by an aperture at each of the opposing major surfaces and a through-passage having an interconnecting surface extending between the apertures of the opposing major surfaces;
wherein each interconnecting surface comprises one or more electrodes;
each manipulator further comprising a potential divider comprising two or more resistive elements connected in series, the potential divider comprising an intermediate node between each pair of adjacent resistive elements, wherein at least one resistive element is formed within the substrate so as to extend between the opposing major surfaces of the substrate;
wherein the intermediate node is electrically connected to at least one of the one or more electrodes.

* * * * *